US008443233B2

(12) United States Patent
Schuetz

(10) Patent No.: US 8,443,233 B2
(45) Date of Patent: May 14, 2013

(54) METHODS AND SYSTEMS FOR FAILURE ISOLATION AND DATA RECOVERY IN A CONFIGURATION OF SERIES-CONNECTED SEMICONDUCTOR DEVICES

(75) Inventor: Roland Schuetz, Ottawa (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 0 days.

(21) Appl. No.: 12/945,280

(22) Filed: Nov. 12, 2010

(65) Prior Publication Data

US 2011/0060937 A1    Mar. 10, 2011

Related U.S. Application Data

(60) Division of application No. 11/941,131, filed on Nov. 16, 2007, now Pat. No. 7,836,340, which is a continuation of application No. PCT/CA2007/002068, filed on Nov. 15, 2007.

(51) Int. Cl.
*G06F 11/00* (2006.01)
(52) U.S. Cl.
USPC .................................. 714/25; 714/48; 714/2
(58) Field of Classification Search ............. 714/25, 714/2, 48
See application file for complete search history.

(56) References Cited

U.S. PATENT DOCUMENTS

| 4,174,536 A | 11/1979 | Misunas et al. |
| 5,243,703 A | 9/1993 | Farmwald et al. |
| 5,319,598 A | 6/1994 | Aralis et al. |
| 5,404,460 A | 4/1995 | Thomsen et al. |
| 5,430,859 A | 7/1995 | Norman et al. |
| 5,452,259 A | 9/1995 | McLaury |
| 5,475,854 A | 12/1995 | Thomsen et al. |
| 5,636,342 A | 6/1997 | Jeffries |
| 5,721,840 A | 2/1998 | Soga |

(Continued)

FOREIGN PATENT DOCUMENTS

| CA | 1 281 775 C | 3/1991 |
| WO | 2005/069150 A1 | 7/2005 |
| WO | 2006/036811 A3 | 4/2006 |

OTHER PUBLICATIONS

Stephen L Diamond, "SyncLink: High-speed DRAM for the future", Micro Standards, IEEE Micro, Dec. 1996, pp. 74-75.

(Continued)

*Primary Examiner* — Scott Baderman
*Assistant Examiner* — Sarai Butler

(57) ABSTRACT

A method of identifying at least one anomalous device in a configuration of series-connected semiconductor devices, comprising: selecting a device in the configuration; sending a command to the selected device, the command for placing the selected device into a recovery mode of operation; attempting to elicit identification data from the selected device while in the recovery mode of operation; if the attempt is successful, selecting a next device in the configuration of series-connected semiconductor devices and repeating the sending and the attempting to elicit; and if the attempt is unsuccessful, concluding that the selected device is an anomalous device. Also, a method of recovering data from a configuration of series-connected semiconductor memory devices having undergone a failure, comprising: placing an operable device of the configuration into a recovery mode of operation; while the operable device is in the recovery mode of operation, retrieving data currently stored by the operable device; and storing the retrieved data in an alternate memory facility.

24 Claims, 6 Drawing Sheets

U.S. PATENT DOCUMENTS

| | | | |
|---|---|---|---|
| 5,729,683 | A | 3/1998 | Le et al. |
| 5,740,379 | A | 4/1998 | Hartwig |
| 5,768,173 | A | 6/1998 | Seo et al. |
| 5,777,488 | A | 7/1998 | Dryer et al. |
| 5,806,070 | A | 9/1998 | Norman et al. |
| 5,828,899 | A | 10/1998 | Richard et al. |
| 5,835,935 | A | 11/1998 | Estakhri et al. |
| 5,859,809 | A | 1/1999 | Kim |
| 5,896,400 | A | 4/1999 | Roohparvar et al. |
| 5,898,615 | A | 4/1999 | Chida |
| 6,002,638 | A | 12/1999 | John |
| 6,009,479 | A | 12/1999 | Jeffries |
| 6,052,331 | A | 4/2000 | Araki et al. |
| 6,144,576 | A | 11/2000 | Leddige et al. |
| 6,148,363 | A | 11/2000 | Lofgren et al. |
| 6,304,921 | B1 | 10/2001 | Rooke |
| 6,317,350 | B1 | 11/2001 | Pereira et al. |
| 6,317,352 | B1 | 11/2001 | Halbert et al. |
| 6,317,812 | B1 | 11/2001 | Lofgren et al. |
| 6,453,365 | B1 | 9/2002 | Habot |
| 6,658,509 | B1 | 12/2003 | Bonella et al. |
| 6,680,904 | B1 | 1/2004 | Kaplan et al. |
| 6,715,044 | B2 | 3/2004 | Lofgren et al. |
| 6,763,426 | B1 | 7/2004 | James et al. |
| 6,792,003 | B1 | 9/2004 | Potluri et al. |
| 6,799,133 | B2 | 9/2004 | McIntosh et al. |
| 6,928,501 | B2 | 8/2005 | Andreas et al. |
| 6,931,571 | B2 | 8/2005 | Bernadat et al. |
| 6,944,697 | B2 | 9/2005 | Andreas |
| 6,950,325 | B1 | 9/2005 | Chen |
| 6,961,882 | B2 | 11/2005 | Manfred et al. |
| 6,978,402 | B2 | 12/2005 | Hirabayashi |
| 6,996,644 | B2 | 2/2006 | Schoch et al. |
| 7,024,605 | B2 | 4/2006 | Sera et al. |
| 7,031,221 | B2 | 4/2006 | Mooney et al. |
| 7,032,039 | B2 | 4/2006 | DeCaro |
| 7,047,450 | B2 * | 5/2006 | Iwamitsu et al. ............... 714/43 |
| 7,072,994 | B2 | 7/2006 | Britton |
| 7,093,076 | B2 | 8/2006 | Kyung |
| 7,130,958 | B2 | 10/2006 | Chou et al. |
| 7,168,027 | B2 | 1/2007 | Lee et al. |
| 7,210,634 | B2 | 5/2007 | Sapiro |
| 7,308,524 | B2 | 12/2007 | Grundy et al. |
| 2002/0188781 | A1 | 12/2002 | Schoch et al. |
| 2003/0163634 | A1 * | 8/2003 | Kim ............... 711/103 |
| 2004/0001380 | A1 | 1/2004 | Becca et al. |
| 2004/0019736 | A1 | 1/2004 | Kim et al. |
| 2004/0024960 | A1 | 2/2004 | King et al. |
| 2004/0039854 | A1 | 2/2004 | Estakhri et al. |
| 2004/0073829 | A1 | 4/2004 | Olarig |
| 2004/0199721 | A1 | 10/2004 | Chen |
| 2004/0230738 | A1 | 11/2004 | Lim et al. |
| 2005/0060598 | A1 * | 3/2005 | Klotz et al. ............... 714/4 |
| 2005/0160218 | A1 | 7/2005 | See et al. |
| 2005/0213421 | A1 | 9/2005 | Polizzi et al. |
| 2005/0262422 | A1 | 11/2005 | Yamauchi |
| 2006/0005078 | A1 | 1/2006 | Guo et al. |
| 2006/0036895 | A1 * | 2/2006 | Henrickson ............... 714/4 |
| 2006/0050594 | A1 | 3/2006 | Park |
| 2006/0053331 | A1 * | 3/2006 | Chou et al. ............... 714/2 |
| 2006/0218451 | A1 * | 9/2006 | Abe ............... 714/52 |
| 2006/0239107 | A1 * | 10/2006 | Boecker et al. ........... 365/230.06 |
| 2007/0043975 | A1 | 2/2007 | Varadarajan et al. |
| 2007/0076479 | A1 | 4/2007 | Kim et al. |
| 2007/0076502 | A1 | 4/2007 | Pyeon et al. |
| 2007/0096774 | A1 | 5/2007 | Yang et al. |
| 2007/0109833 | A1 | 5/2007 | Pyeon et al. |
| 2007/0233903 | A1 | 10/2007 | Pyeon |
| 2007/0233917 | A1 | 10/2007 | Pyeon et al. |
| 2007/0234071 | A1 | 10/2007 | Pyeon |
| 2008/0016269 | A1 | 1/2008 | Chow et al. |
| 2008/0082856 | A1 * | 4/2008 | French et al. ............... 714/2 |
| 2008/0140899 | A1 | 6/2008 | Oh et al. |
| 2008/0140916 | A1 | 6/2008 | Oh et al. |
| 2008/0168296 | A1 | 7/2008 | Oh et al. |
| 2008/0226004 | A1 | 9/2008 | Oh |
| 2008/0246504 | A1 | 10/2008 | Surico et al. |
| 2009/0097342 | A1 | 4/2009 | Tseng et al. |
| 2009/0129184 | A1 | 5/2009 | Schuetz |

OTHER PUBLICATIONS

Stein Gjessing et al., "A RAM link for high speed", IEEE Spectrum, Oct. 1992, pp. 52-53.

Stein Gjessing et al., "RamLink: A High-Bandwidth Point-to-Point Memory Architecture", Copyright 1992 IEEE, pp. 328-331.

Stein Gjessing et al., "Performance of the RamLink Memory Architcture", Copyright 1994 IEEE, pp. 154-162.

John G. Maneatis, "Low-Jitter Process-Independent DLL and PLL Based on Self-Biased Techniques", IEEE Journal of Solid-State Circuits, vol. 31, No. 11, Nov. 1996, pp. 1723-1732.

Yoichi Oshima et al., "High-Speed Memory Architectures for Multimedia Applications", IEEE, Circuits & Devices, Jan. 1997, pp. 8-13.

Joseph Kennedy et al.,"A 2Gb/s Point-to-Point Heterogeneous Voltage Capable DRAM Interface for Capacity-Scalable Memory Subsystems",IEEE ISSCC 2004/Session 11/DRAM/11.8,10 pgs.

Jae-Kwan Kim et al., "A 3.6Gb/s/pin Simultaneous Bidirectional (SBD) I/O Interface for High-Speed DRAM", IEEE ISSCC 2004 / Session 22 / DSL and Multi-Gb/s I/O 122.7, 8 pgs.

Craig L. King et al., "Communicating with Daisy Chained MCP42XXX Digital Potentiometers", MICROCHIP AN747, 2001 Microchip Technology Inc., 8 pages.

"1024K I2CTM CMOS Serial EEPROM", MICROCHIP 24AA1025/24LC1025/ 24FC1025, 2006 Microchip Technology Inc., 22 pages.

"How to Use OTP Registers for Security Applications", Application Note 717, Oct. 1999, Intel Corporation, 10 pages.

Intel, "Clocking—Lecture 2 and 3, Purpose—Clocking Design Topics", http://download.intel.com/education/highered/signal/ELCT865/Class2_3_4_Clocking.ppt, Dec. 4, 2002, 42 pages.

ATMEL—"8-megabit 2.5-volt Only or 2.7-volt Only DataFlash" — AT5DB081B, Rev. 2225H-DFLSH-10/04, Atmel Corporation 2004, 33 pages.

ST—M25P20—"2Mbit, Low Voltage, Serial Flash Memory With 40MHz SPI Bus Interface", Aug. 2005, STMicroelectronics, 40 pages.

SST—"16 Mbit SPI Serial Flash" —SST25VF016B, Preliminary Specifications, 2005 Silicon Storage Technology, Inc., 28 pages.

"The I2C-Bus Specification", Version 2.1, Jan. 2000, Philips Semiconductors, 46 pages.

FBDIMM—"DDR2 Fully Buffered DIMM" 240pin FBDIMMs based on 512Mb C-die (RoHS complaint)—DDR2 SDRAM, Rev. 1.3—Sep. 2006, Samsung Electronics, 32 pages.

S70GL01GN00 MirrorBit Flash, Publication No. S70GL01GN00_00, Revision A, Amendment I, Issue Date Jun. 1, 2005, Spansion LLC, 83 pages.

"IEEE Standard for High-Bandwidth Memory Interface Based on Scalable Coherent Interface (SCI) Signaling Technology (RamLink)", IEEE Standards Board Mar. 19, 1996, 98 pages.

"Intel StrataFlash Wireless Memory (L18)" —28F640L18, 28F128L18, 28F256L18, Order No. 251902, Revision: 010, Aug. 2005, 106 pages.

"A Practical Guide to Serial Storage Architecture for AIX", IBM Corporation, International Technical Support Organization, First Edition (Jul. 1996), 194 pages.

"HyperTransport I/O Link Specification", Revision 3.00, Document #HTC20051222-0046-0008, 2001-2006 HyperTransport Technology Consortium, Apr. 21, 2006, 427 pages.

"HyperTransport I/O Link Specification", Revision 3.00a, Document #HTC20051222-0046-0017, 2001-2006 HyperTransport Technology Consortium, Nov. 22, 2006, 441 pages.

International Search Report mailed on Feb. 26, 2008 in connection with International Patent Application Serial No. PCT/CA2007/002092, 3 pages.

Written Opinion of the International Searching Authority mailed on Feb. 26, 2008 in connection with International Patent Application Serial No. PCT/CA2007/002092, 4 pages.

International Search Report mailed on May 20, 2008 in connection with International Patent Application Serial No. PCT/CA2008/000237, 4 pages.

Written Opinion of the International Searching Authority mailed on May 20, 2008 in connection with International Patent Application Serial No. PCT/CA2008/000237, 6 pages.

International Search Report mailed on Sep. 2, 2008 in connection with International Patent Application Serial No. PCT/CA2007/002068, 4 pages.

Written Opinion of the International Searching Authority mailed on Sep. 2, 2008 in connection with International Patent Application Serial No. PCT/CA20071002068, 4 pages.

"HyperTransport TM I/O Link Specification", Revision 2.00b, Document # HTC20031217-0036-0010, HyperTransport Technology Consortium, Apr. 27, 2005, 324 pages.

Office Action issued by the United States Patent and Trademark Office on Feb. 25, 2010 in connection with U.S. Appl. No. 11/941,131, 20 pages.

Samsung Electronics, "512M × 8 Bit / 1G × 8 Bit NAND Flash Memory", K9K8GO8U1M, K9F4G08U0M, Preliminary Flash Memory, K9XXG08UXM, May 3, 2005, 43 pages.

* cited by examiner

METHODS AND SYSTEMS FOR FAILURE ISOLATION AND DATA RECOVERY IN A CONFIGURATION OF SERIES-CONNECTED SEMICONDUCTOR DEVICES

This application is a Divisional of U.S. patent application Ser. No. 11/941,131 to Roland Schuetz, filed on Nov. 16, 2007, now U.S. Pat. No. 7,836,340 which is a Continuation of PCT International Patent Application Ser. No. PCT/CA2007/002068, filed on Nov. 15, 2007. Benefit is claimed under 35 U.S.C. §120. The aforementioned applications are hereby incorporated by reference herein.

BACKGROUND

Computer-based systems typically contain semiconductor devices such as memory. The semiconductor devices are controlled by a controller, which may form part of the central processing unit (CPU) of the computer or may be separate therefrom. The controller has an interface for communicating information with the semiconductor devices. Known interfaces include interfaces that are "parallel" and interfaces that are "serial".

Interfaces that are parallel use a large number of pins to read and write information. As the number of pins and wires increases, so do a number of undesired effects, including inter-symbol interference, signal skew and cross talk. These effects are exacerbated at high operating frequencies. Thus, an interface that is serial with a minimal number of input pins and wires may be desirable. A plurality of semiconductor devices can be connected to one another in series via their interfaces in a point-to-point fashion, thereby forming a configuration of series-connected semiconductor devices.

In configuration of series-connected semiconductor devices, one or more of the devices may fail, while leaving other ones of the devices in an operable state. The operable devices are still capable of functioning normally, although the functionality of the configuration of series-connected semiconductor devices as a whole will have been impaired. Methods and systems providing the ability to identify one or more of the failed devices would be useful. Also, methods and systems for recovering data from one or more of the still operable devices in the configuration of series-connected semiconductor devices would be desirable.

SUMMARY OF THE INVENTION

Thus, it would be advantageous to improve methods and systems for failure isolation and data recovery in a configuration of series-connected semiconductor devices.

According to a first broad aspect, the present invention seeks to provide a method of identifying at least one anomalous device in a configuration of series-connected semiconductor devices. The method comprises selecting a device in the configuration of series-connected semiconductor devices; sending a command to the selected device, the command for placing the selected device into a recovery mode of operation; attempting to elicit identification data from the selected device while in the recovery mode of operation; if the attempt is successful, selecting a next device in the configuration of series-connected semiconductor devices and repeating the sending and the attempting to elicit; and if the attempt is unsuccessful, concluding that the selected device is an anomalous device.

According to a second broad aspect, the present invention seeks to provide a computer-readable medium comprising computer-readable program code which, when interpreted by a controller, causes the controller to execute a method of recovering data from a configuration of series-connected semiconductor memory devices having undergone a failure. The computer-readable program code comprises first computer-readable program code for causing the controller to select a device in the configuration of series-connected semiconductor devices; second computer-readable program code for causing the controller to send a command to the selected device, the command for placing the selected device into a recovery mode of operation; third computer-readable program code for causing the controller to attempt to elicit identification data from the selected device while in the recovery mode of operation; fourth computer-readable program code for causing the controller to select a next device in the configuration of series-connected semiconductor devices and repeat the sending and the attempting to elicit, if the attempt is successful; and fifth computer-readable program code for causing the controller to conclude that the selected device is an anomalous device if the attempt is unsuccessful.

According to a third broad aspect, the present invention seeks to provide a semiconductor device, comprising: an interface comprising a plurality of input ports and a plurality of output ports; an information storage medium; a control module operable to cause information to be stored in, or retrieved from, the information storage medium, the control module further operable to receive commands and data from a controller over the input ports in a downstream direction while in a normal mode of operation, the control module further operable to send commands and data to the controller over the output ports in the downstream direction while in the normal mode of operation, the control module further operable to respond to a command from the controller to enter into a recovery mode of operation in which the semiconductor device is operable to either (I) receive commands from the controller over at least one of the output ports or (II) send data to the controller over at least one of the input ports, in an upstream direction opposite to the downstream direction, depending on a directionality to be adopted by the semiconductor device when in the recovery mode of operation.

According to a fourth broad aspect, the present invention seeks to provide a method for execution by a semiconductor device in a configuration of series-connected semiconductor devices operatively coupled to a controller. The method comprises communicating with the controller in a normal mode of operation by receiving commands and data from a controller over a set of input ports in a downstream direction and sending commands and data to the controller over a set of output ports in the downstream direction; entering into a recovery mode of operation in response to receipt of a command from the controller to enter into the recovery mode of operation; communicating with the controller in the recovery mode of operation by either (I) receiving commands from the controller over at least one of the output ports; or (II) sending data to the controller over at least one of the input ports, in an upstream direction opposite to the downstream direction, and depending on a directionality adopted by the semiconductor device when in the recovery mode of operation.

According to a fifth broad aspect, the present invention seeks to provide a system, comprising: a configuration of series-connected semiconductor devices, having an input end and an output end; a controller electrically connected to the configuration of series-connected semiconductor devices, the controller configured for: selecting a device in the configuration of series-connected semiconductor devices; sending a command to the selected device, the command for placing the selected device into a recovery mode of operation; attempting to elicit identification data from the selected device while in the recovery mode of operation; if the attempt is successful, selecting a next device in the configuration of series-connected semiconductor devices and repeating the sending and the attempting to elicit; and if the attempt is unsuccessful, concluding that the selected device is an anomalous device.

According to a sixth broad aspect, the present invention seeks to provide a method of recovering data from a configuration of series-connected memory devices having undergone a failure. The method comprises placing an operable device of the configuration of series-connected semiconductor memory devices into a recovery mode of operation; while the operable device is in the recovery mode of operation, retrieving data currently stored by the operable device; and storing the retrieved data in an alternate memory facility.

According to a seventh broad aspect, the present invention seeks to provide a computer-readable medium comprising computer-readable program code which, when interpreted by a controller, causes the controller to execute a method of recovering data from a configuration of series-connected semiconductor memory devices having undergone a failure. The computer-readable program code comprises first computer-readable program code for causing the controller to place an operable device of the configuration of series-connected semiconductor memory devices into a recovery mode of operation; second computer-readable program code for causing the controller to retrieve data currently stored by the operable device while the operable device is in the recovery mode of operation; and third computer-readable program code for causing the controller to store the retrieved data in an alternate memory facility.

According to an eighth broad aspect, the present invention seeks to provide a system, comprising: a configuration of series-connected semiconductor memory devices; an alternate memory facility; and a controller electrically connected to the configuration of series-connected semiconductor memory devices and to the alternate memory facility. The controller is configured for: issuing a particular command to place an operable device of the configuration of series-connected semiconductor memory devices into a recovery mode; while the operable device is in the recovery mode of operation, retrieving data currently stored by the operable device; and storing the retrieved data in the alternate memory facility.

According to a ninth broad aspect, the present invention seeks to provide a system, comprising a configuration of series-connected semiconductor memory devices; an alternate memory facility; means for placing an operable device of the configuration of series-connected semiconductor memory devices into a recovery mode; means for retrieving data currently stored by the operable device while the operable device is in the recovery mode of operation; and means for transferring the retrieved data in the alternate memory facility.

According to a tenth broad aspect, the present invention seeks to provide a method of recovering data from a configuration of series-connected semiconductor memory devices having undergone a failure. The method comprises selecting at least one operable device of the configuration of series-connected semiconductor memory devices; sending a command to the selected device; in response to receipt of the command, the selected device retrieving data currently stored by the selected device and outputting the retrieved data; receiving the data output by the operable device; storing the retrieved data in an alternate memory facility; wherein the sending or the receiving involves the selected device communicating in a direction opposite to a direction in which the selected device communicated prior to the failure.

BRIEF DESCRIPTION OF THE DRAWINGS

Reference will now be made, by way of example, to the accompanying drawings.

DETAILED DESCRIPTION

In the following detailed description of embodiments of the present invention, reference is made to the accompanying drawings which form a part hereof, and which show by way of illustration certain embodiments in which the present invention may be practiced. These embodiments are described in sufficient detail to enable those of ordinary skill in the art to practice those embodiments, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Examples of semiconductor devices contemplated herein include devices with serial input bit stream control, i.e., which perform actions in response to signals received at one or more input ports, such signals being sampled at "acquisition instants" that depend on the behavior of a clock signal. Accordingly, the semiconductor devices contemplated herein can be semiconductor integrated circuit (IC) devices such as memories (including volatile and/or non-volatile memories), central processing units, graphics processing units, display controller ICs, disk drive ICs, solid state drives and so on. Functionally, the semiconductor devices contemplated herein may be semiconductor memory devices, including those characterized as NAND Flash electrically erasable programmable read-only memory (EEPROM), NOR Flash EEPROM, AND Flash EEPROM, DiNOR Flash EEPROM, Serial Flash EEPROM, dynamic random access memory (DRAM), static random access memory (SRAM), read-only memory (ROM), electrically programmable read-only memory (EPROM), ferroelectric random access memory (FRAM), magnetoresistive random access memory (MRAM), phase change random access memory (PRAM or PCRAM), to name a few non-limiting possibilities.

Examples of a configuration of series-connected semiconductor devices are provided in the following U.S. patent applications, the contents of which are entirely incorporated herein by reference:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006.
Ser. No. 11/771,023 filed Jun. 29, 2007; and
Ser. No. 11/771,241 filed Jun. 29, 2007.

Figure 1:
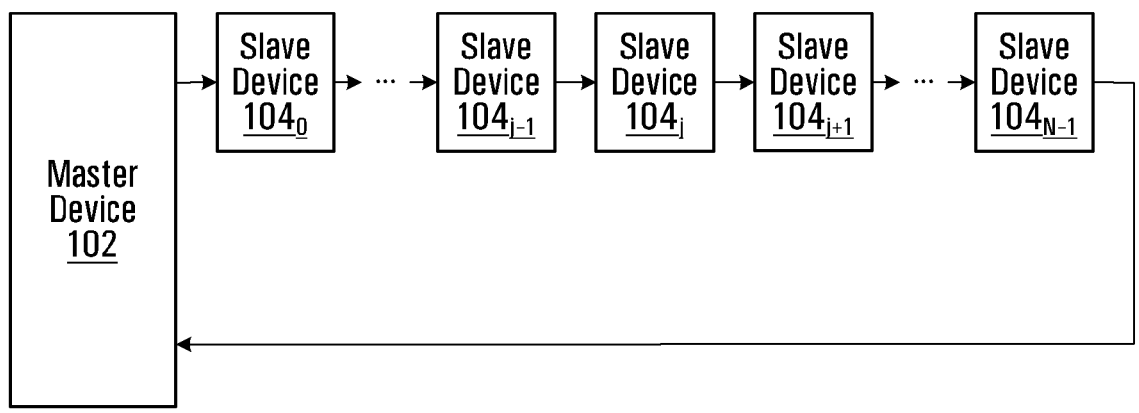
FIG. 1 is a block diagram of a configuration of series-connected slave devices in communication with a master device, in accordance with a non-limiting embodiment.

FIG. 1 shows an example of a configuration of series-connected semiconductor devices in communication with a controller 102. Specifically, there are N devices, including a first device $104_0$ at an input end of the configuration of series-connected semiconductor devices, a j$-1^{th}$ device $104_{j-1}$, a j$^{th}$ device $104_j$, a j+$1^{th}$ device $104_{j+1}$ and a last device $104_{N-1}$ at an output end of the configuration of series-connected semiconductor devices. The devices $104_{0 \ldots N-1}$ can be semiconductor devices, such as memory devices for example. In the case where the devices $104_{0 \ldots N-1}$ are indeed memory devices, the controller 102 can be implemented as a memory controller. It should be understood that the controller 102 can itself be a semiconductor device. In some examples, the controller 102 can be an Application-Specific Integrated Circuit (ASIC).

The controller 102 is hereinafter referred to as a "master device", while the devices $104_{0 \ldots N-1}$ are hereinafter referred to as "slave devices". Thus, slave device $104_j$ is in communication with a previous upstream device in the configuration of series-connected semiconductor devices and a next downstream device in the configuration of series-connected semiconductor devices. Where j=0, the previous upstream device is the master device 102 and the next downstream device is slave device $104_1$. Where 0<j<N−1, the previous upstream device is slave device $104_{j-1}$ and the next downstream device is slave device $104_{j+1}$. Where j=N−1, the previous upstream device is $104_{N-2}$ and the next downstream device is the master device 102.

It should of course be apparent to those of ordinary skill in the art that the configuration of series-connected semiconductor devices may include any number of slave devices. By way of non-limiting example, the master device 102 and the slave devices $104_{0 \ldots N-1}$ may be implemented in a single multi-chip package (MCP) or as discrete units.

It should also be appreciated that different types of slave devices can be utilized as long as they have compatible interfaces. For example, where the slave devices $104_{0 \ldots N-1}$ are memory devices, such memory devices may be of the same type (e.g., all having NAND Flash memory core), or they may be of different types (e.g., some having NAND Flash memory core and others having NOR Flash memory core). Other combinations of memory types and device types will occur to those of skill in the art and are within the scope of the present invention.

Figure 2:
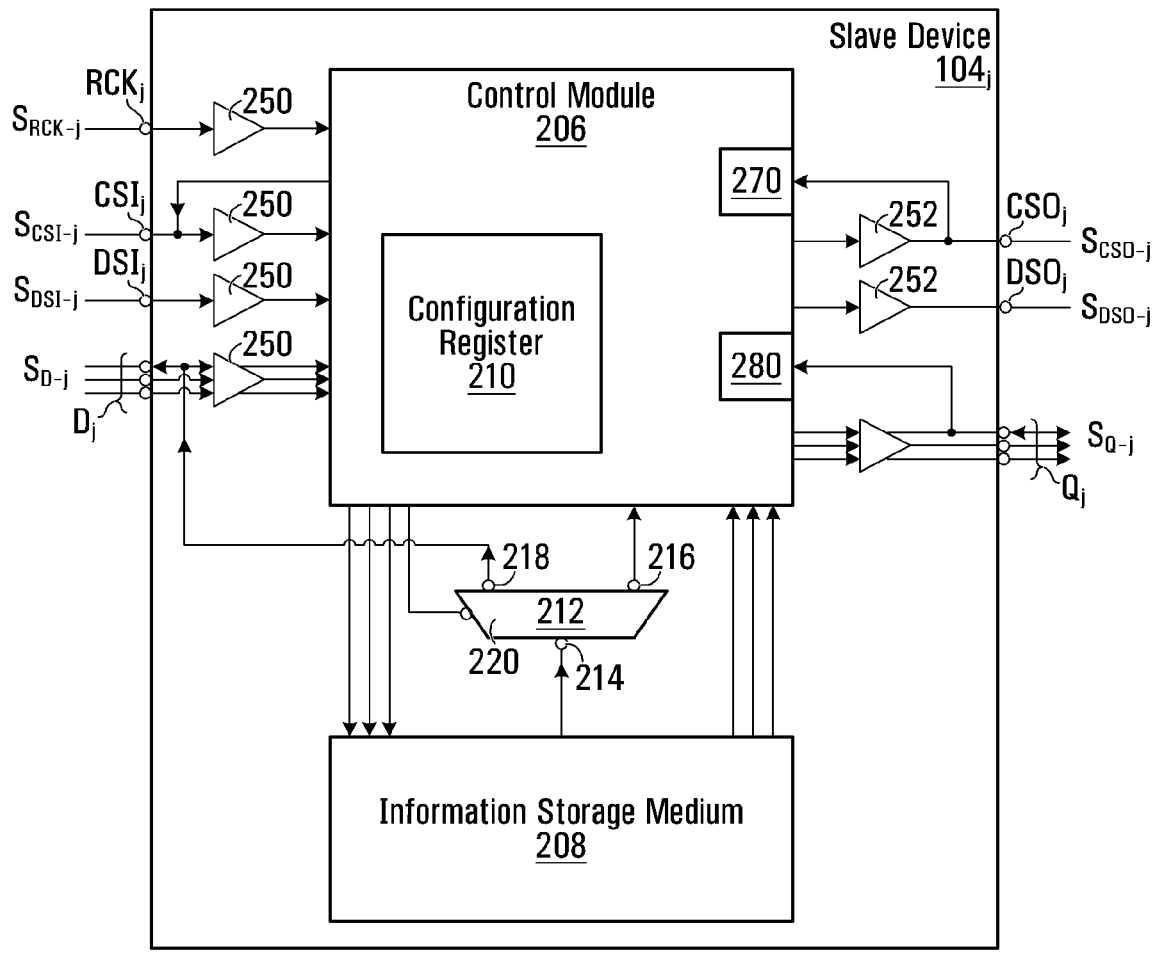
FIG. 2 is a block diagram of one of the slave devices of FIG. 1, in accordance with a non-limiting embodiment.

With reference now to FIG. 2, slave device $104_j$ includes a control module 206, an information storage medium 208 and an interface comprising a plurality of input ports and output ports. Slave device $104_j$ also includes a plurality of registers, including a configuration register 210.

Slave device $104_j$ selectively operates in a so-called "normal" mode of operation or a so-called "recovery" mode of operation. In the normal mode of operation, the control module 206 is responsive to signals received from the master device 102 via the input ports of the interface of slave device $104_j$. Specifically, the control module 206 performs various control and processing functions with access to the information storage medium 208 in response to signals arriving via the input ports, and provides signals to the next downstream device via the output ports. As mentioned above, the next downstream device can be another slave device or the master device 102, for example, depending on the relative position of slave device $104_j$ within the configuration of series-connected semiconductor devices.

To be more specific, the interface of slave device $104_j$ includes a data input port (hereinafter, the "$D_j$ port") and a data output port (hereinafter, the "$Q_j$ port"). The $D_j$ port is used to transfer information (e.g., address, command and data information) carried by an input information signal $S_{D-j}$ into slave device 104, with some of this information being destined for the control module 206 and some being destined for the information storage medium 208. The $Q_j$ port provides an output information signal $S_{Q-j}$ that carries information (e.g., address, command and data information) out of slave device 104, with some of this information possibly having originated from the information storage medium 208. The $D_j$ and $Q_j$ ports may be configured to have multiple pins, although less than for an interface that is parallel. In some non-limiting example embodiments, each of the $D_j$ and $Q_j$ ports may be configured to have 1, 2, 4 or 8 pins.

In addition, the interface of slave device $104_j$ includes a command strobe input port (hereinafter, the "CSI port") and a command strobe echo output port (hereinafter, the "CSO, port"). The CSI port receives a command strobe signal $S_{CSI-j}$. The command strobe signal $S_{CSI-j}$ is used by slave device $104_j$ to enable the $D_j$ port such that when the command strobe signal $S_{CSI-j}$ is asserted, this allows the serial input of data to slave device $104_j$ via the $D_j$ port for processing by the control module 206. Such data may include commands destined for slave device 104-j or another slave device further downstream. The command strobe signal $S_{CSI-j}$ is propagated through to a command strobe echo signal $S_{CSO-j}$ at the CSO, port of slave device $104_j$.

In addition, the interface of slave device $104_j$ includes a data strobe input port (hereinafter, the "DSI$_j$ port") and a data strobe echo output port (hereinafter, the "DSO$_j$ port"). The DSI$_j$ port receives a data strobe signal $S_{DSI-j}$. The data strobe signal $S_{DSI-j}$ is used by slave device $104_j$ to enable the $Q_j$ port such that when the data strobe signal $S_{DSI-j}$ is asserted, this allows the serial output of data expected to be sent out by device $104_j$ via the $Q_j$ port. The data strobe signal $S_{DSI-j}$ is also propagated through to a data strobe echo signal $S_{DSO-j}$ at the DSO$_j$ port of slave device $104_j$.

In addition, the interface of slave device $104_j$ includes a clock input port (hereinafter, the "RCK$_j$ port"). The RCK$_j$ port receives an input clock signal $S_{RCK-j}$ from the master device 102. The input clock signal $S_{RCK-j}$ is received either directly from the master device 102 or is a propagated version received from the previous upstream device. The input clock signal $S_{RCK-j}$ is used to control latching of the signals present at the $D_j$ port into registers internal to slave device 104, as well as to control latching of signals onto the $Q_j$ port from registers internal to slave device $104_j$. The input clock signal $S_{RCK-j}$ is also used to control latching of the signals present at the CSI$_j$ and DSI$_j$ ports into registers internal to slave device $104_j$ and subsequently onto the CSO, and DSO$_j$ ports, respectively.

In addition, the interface of slave device $104_j$ may include a chip select port (not shown), which receives a chip select signal from the master device 102 that enables operation of slave device $104_j$ and possibly other slave devices concurrently. A reset port (not shown) may also be provided, for the purposes of carrying a reset signal from the master device 102 for resetting one or more functions of the slave device 104.

It is noted that the aforementioned command and data strobe echo signals $S_{CSO-j}$ and $S_{DSO-j}$ are propagated versions of the command strobe signal $S_{CSI-j}$ and the data strobe signal $S_{DSI-j}$, respectively, and, as such, will have undergone a delay, referred to herein as an input-to-output latency (or "flow-through" latency) and denoted $T_{IOL-j}$. $T_{IOL-j}$, which in one embodiment can be expressed in terms of a number of clock cycles, characterizes the design of slave device $104_j$ and, more particularly, the control module 206 of slave device $104_0$. $T_{IOL-j}$ can be different for devices of different types and specifications. In a non-limiting embodiment, $T_{IOL-j}$ is designed to be as low as possible for a nominal clock rate, while guaranteeing that the control module 206 has sufficient time to process information carried by the input information signal $S_{D-j}$ at the $D_j$ port and complete any requisite interactions with the information storage medium 208.

Specifically, upon assertion of the command strobe signal $S_{CSI-j}$, it is expected that the data carried by the input information signal $S_{D-j}$ will have been processed by slave device $104_j$ after a delay of $T_{IOL-j}$ clock cycles. Thus, one can view the state of the command strobe signal $S_{CSI-j}$ as establishing a time window during which the input information signal $S_{D-j}$ carries data to be processed by slave device $104_j$. Meanwhile, the current states of the command strobe signal $S_{CSI-j}$, the data strobe signal $S_{DSI-j}$ and the input information signal $S_{D-j}$ are transferred out onto the command strobe echo signal $S_{CSO-j}$, the data strobe echo signal $S_{DSO-j}$ and the output information signal $S_{Q-j}$, respectively, so that they appear thereon after the aforesaid delay of $T_{IOL-j}$ clock cycles. Any relationship in terms of synchronism that may have existed among the input information signal $S_{D-j}$, the command strobe signal $S_{CSI-j}$ and the data strobe signal $S_{DSI-j}$ is therefore preserved for the benefit of the next downstream device.

The impact of assertion of the data strobe signal $S_{DSI-j}$ is slightly different. On the one hand, slave device $104_j$ may expect to send out data based on a previously received instruction (e.g., a READ command as will be described below). Here, assertion of the data strobe signal $S_{DSI-j}$ will cause such data to begin to appear in the output information signal $S_{Q-j}$ after a delay of $T_{IOL-j}$ clock cycles. Meanwhile, the current states of the command strobe signal $S_{CSI-j}$ and the data strobe signal $S_{DSI-j}$ are transferred out onto the echo signals $S_{CSO-j}$ and $S_{DSO-j}$, respectively, so that they appear thereon after the aforesaid delay of $T_{IOL-j}$ clock cycles. Thus, where slave device $104_j$ indeed expects to send out information, one can view the state of the data strobe echo signal $S_{DSO-j}$ as establishing a time window during which the output information signal $S_{Q-j}$ validly carries data that has been output by slave device $104_j$.

On the other hand, where slave device $104_j$ does not expect to send out information based on a previously received instruction (or in the absence of such instruction altogether), assertion of the data strobe signal $S_{DSI-j}$ is meaningless for slave device $104_j$. In such cases, the current states of the command strobe signal $S_{CSI-j}$, the data strobe signal $S_{DSI-j}$ and the input information signal $S_{D-j}$ are simply transferred out onto the command strobe echo signal $S_{CSO-j}$, the data strobe echo signal $S_{DSO-j}$ and the output information signal $S_{Q-j}$, respectively, so that they appear thereon after the aforesaid delay of $T_{IOL-j}$ clock cycles. Any synchronism relationship that may have existed among the input information signal $S_{D-j}$, the command strobe signal $S_{CSI-j}$ and the data strobe signal $S_{DSI-j}$ is therefore preserved for the benefit of the next downstream device.

As mentioned above, slave device $104_j$ can operate in a normal mode of operation or in a recovery mode of operation. The behaviour described above is characteristic of the normal mode of operation. To enable operation in the recovery mode of operation, slave device $104_j$ exhibits a certain degree of bidirectional functionality. Specifically, the $CSO_j$ port is configured to be bidirectional, thereby to allow back-propagated commands received from the next downstream device to be latched by slave device $104_j$ and processed. The control module 206 of slave device $104_j$ is thus equipped with circuitry 270 required to latch and process back-propagated commands received over the $CSO_j$ port. As will be described in further detail later on, the $CSO_j$ port may be used to cause slave device $104_j$ to enter into the recovery mode of operation, and therefore it is within the scope of the present invention for the control module 206 to be continually attentive to back-propagated commands received over the $CSO_j$ port. When such back-propagated commands are destined for a device further upstream than slave device 104, then forwarding to the previous upstream device is appropriate, and to this end the $CSI_j$ port is also configured to be bidirectional.

In addition, one or more of the pins of the $D_j$ port are configured to be bidirectional, in order to allow data to be back-propagated to the previous upstream device when necessary in the recovery mode of operation. In some cases, the data that is back-propagated to the previous upstream device via the bidirectional pin(s) of the $D_j$ port may itself have been back-propagated to slave device $104_j$ by the next downstream device. Accordingly, one or more of the pins of the $Q_j$ port are also configured to be bidirectional. The control module 206 of slave device $104_j$ is thus equipped with circuitry 280 required to latch and process data received over the bidirectional pin(s) of the $Q_j$ port and to transfer this data over to the bidirectional pin(s) of the $D_j$ port, leading towards the previous upstream device.

In other cases, the data that is back-propagated to the previous upstream device via the bidirectional pin(s) of the $D_j$ port may originate from the information storage medium 208 of slave device $104_j$. Accordingly, slave device $104_j$ is equipped with a switching element 212 that receives data from the information storage medium 208 at a switching element input port 214. The switching element 212 also has a first switching element output port 216 electrically connected to the $Q_j$ port and a second switching element output port 218 electrically connected to the bidirectional pin(s) of the $D_j$ port. The switching element 212 is used to divert data received at the switching element input port 214 towards either the first switching element output port 216 or the second switching element output port 218 (and therefore to either the $Q_j$ port or the $D_j$ port of slave device $104_j$, respectively), depending upon the value of a select signal received at a switching element select port 220. The select signal is received from the control module 206 and is controlled in a manner to be described later. In one non-limiting example, the switching element can be embodied as a demultiplexer.

Additionally, and optionally, the $DSI_j$ port can also be configured to be bidirectional, to allow the presence of data on the bidirectional pin(s) of the $D_j$ port to be announced to the previous upstream device when such data either originates from the information storage medium 208 of slave device $104_j$ or is being forwarded after having been received from the next downstream device. Indeed, in the latter case, a similar announcement made by the next downstream device will appear at the DSO, port and may need to be back-propagated by slave device 104; hence the DSO, port can also be configured to be bidirectional.

Those skilled in the art will also appreciate that other components may be provided in slave device $104_j$ without departing from the scope of the present invention, such as, for example, buffers, phase shifters, logic sub-circuits, depending on clock rate type (e.g., single data rate versus double data rate), clock response type (e.g., edge-aligned versus center-aligned) and various other aspects of the functionality of slave device $104_j$. For example, in the illustrated non-limiting embodiment, slave device $104_j$ includes a plurality of buffers 250 electrically connected to the $RCK_j$, $D_j$, $DSI_j$ and $CSI_j$ ports and a plurality of buffers 252 electrically connected to the $Q_j$, $DSO_j$ and $CSO_j$ ports. Where a particular one of the buffers 250, 252 is electrically connected to a bidirectional port or pin, the buffer exhibits buffering functionality in both directions of signal flow.

Figure 3:
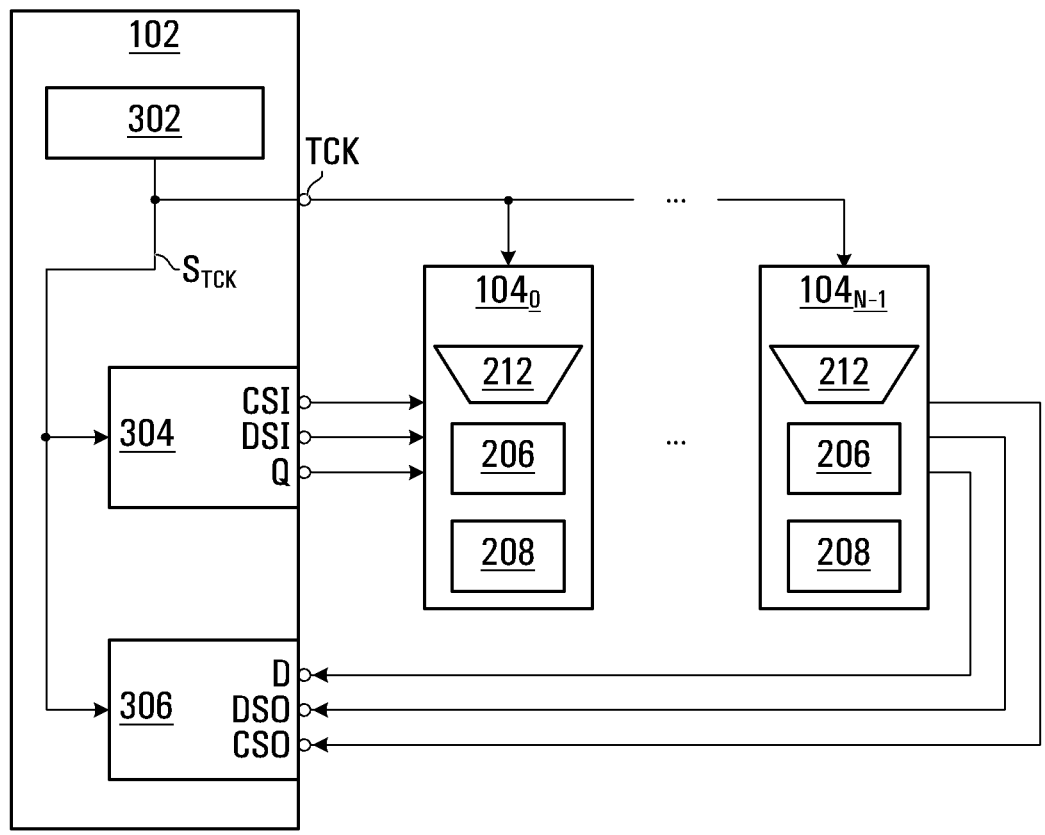
FIG. 3 is a block diagram showing further details of the master device of FIG. 1, in accordance with a non-limiting embodiment.

Reference is now made to FIG. 3, which shows the master device 102 in greater detail. Functionality of the master device 102 may be implemented in software, hardware, control logic, or any combination thereof. In one non-limiting embodiment, the master device 102 may interact with a computing system that provides various high-level functions and executes an operating system. The master device 102 comprises a clock generation module 302, an output port controller 304 with a plurality of output ports and an input port controller 306 with a plurality of input ports.

The clock generation module 302 generates the master output clock signal $S_{TCK}$, which is distributed in a desired manner to the slave devices $104_0 \ldots _{N-1}$, as well as to the output port controller 304 and the input port controller 306. It should be noted that in the non-limiting embodiment shown in FIG. 3, the TCK port is electrically connected to the $RCK_0$, $RCK_1$, $RCK_2$ and $RCK_3$ ports in a multi-drop configuration, thus allowing the same master output clock signal $S_{TCK}$ to be distributed simultaneously to the various slave devices $104_0 \ldots _{N-1}$. In other embodiments, the master output clock signal $S_{TCK}$ can instead be propagated from one slave device to the next. Still other clock distribution topologies are possible without departing from the scope of the present invention.

The output ports of the output port controller 304 carry a group of signals to the input end of the configuration of series-connected semiconductor devices via the first slave device $104_0$. Specifically, the output ports of the output port controller 304 include a master clock output port (hereinafter, the "TCK port") over which is output a master output clock signal $S_{TCK}$, a master serial output port (hereinafter, the "Q port") over which is provided a master serial output information signal $S_Q$, a master command strobe output port (hereinafter, the "CSI port") over which is provided a master command strobe signal $S_{CSI}$, and a master data strobe output port (hereinafter, the "DSI port") over which is provided a master data strobe signal $S_{DSI}$. The interface of the master device 102 may further comprise various other output ports over which can be provided the aforementioned chip select signal and reset signal, as well as various other control and data information destined for the slave devices $104_0 \ldots _{N-1}$. In operation, the output port controller 304 issues commands, and asserts the master command strobe signal $S_{CSI}$ and the master data strobe signal $S_{DSI}$ at the appropriate instants.

In one non-limiting embodiment, the signals output by the output port controller 304 are timed so that the intended acquisition instants are aligned with the falling edges of the master output clock signal $S_{TCK}$. In another non-limiting embodiment, the signals output by the output port controller 304 are timed so that the intended acquisition instants are aligned with the rising edges of the master output clock signal $S_{TCK}$. In yet another non-limiting embodiment, the signals output by the output port controller 304 are timed so that the intended acquisition instants are intermediate the rising and falling edges of the master output clock signal $S_{TCK}$.

For its part, the input port controller 306 receives a group of signals from the output end of the configuration of series-connected semiconductor devices via last slave device $104_{N-1}$. Specifically, the interface of the master device 102 comprises a master serial input port (hereinafter, the "D port") over which is received a master serial input information signal $S_D$ from the last slave device $104_{N-1}$ of the configuration of series-connected semiconductor devices. In addition, the interface of the master device 102 further comprises a master data strobe echo input port (hereinafter, the "DSO" port) over which is received a master data strobe echo signal $S_{DSO}$ from the last slave device $104_{N-1}$ of the configuration of series-connected semiconductor devices. In addition, the interface of the master device 102 further comprises a master command strobe echo input port (hereinafter, the "CSO" port) over which is received a master command strobe echo signal $S_{CSO}$ from the last slave device $104_{N-1}$ of the configuration of series-connected semiconductor devices.

The output ports of the master device 102 (i.e., the Q, CSI and DSI ports) are electrically connected to the input ports of the first slave device $104_0$ (i.e., the $D_0$, $CSI_0$ and $DSI_0$ ports, respectively), whose output ports (i.e., the $Q_0$, $CSO_0$ and $DSO_0$ ports) are electrically connected to the input ports of slave device $104_1$ (i.e., the $D_1$, $CSI_1$ and $DSI_1$ ports, respectively), and so on. Finally, the output ports of slave device $104_{N-2}$ (i.e., the $Q_{N-2}$, $CSO_{N-2}$ and $DSO_{N-2}$ ports) are electrically connected to the input ports of slave device $104_{N-1}$ (i.e., the $D_{N-1}$, $CSI_{N-1}$ and $DSI_{N-1}$ ports, respectively). Finally, the $Q_{N-1}$ port of slave device $104_{N-1}$ is electrically connected to the D port of the master device 102 (allowing delivery of the master serial input information signal $S_D$ to the master device 102), the $CSO_{N-1}$ port of slave device $104_{N-1}$ is electrically connected to the CSO port of the master device 102 (allowing delivery of the master command strobe echo signal $S_{CSO}$ to the master device 102), and the $DSO_{N-1}$ port of slave device $104_{N-1}$ is electrically connected to the DSO port of the master device 102 (allowing delivery of the master data strobe echo signal $S_{DSO}$ to the master device 102).

As mentioned above, the slave devices $104_0 \ldots _{N-1}$ selectively operate in either the normal mode of operation or the recovery mode of operation. Details of how to cause a particular slave device to enter one mode or the other will be provided later on. For now, it is sufficient to recognize that in order to cause a particular slave device to enter into the recovery mode of operation, and to subsequently communicate with the particular slave device while it is in recovery mode, the master device 102 needs to establish communication with the particular device. In the case where a portion of the configuration of series-connected semiconductor devices has failed, only those slave devices that are on "either side" of the failed portion will be reachable. It should thus be appreciated that a particular slave device on either side of the failed portion will be reachable either exclusively by the output port controller 304 or exclusively by the input port controller 306, and not in the ring-like manner that applies when the configuration of series-connected semiconductor devices is fully operational.

To allow communication to be established with a particular slave device on either side of the failed portion of the configuration of series-connected semiconductor devices, the input port controller 304 and the output port controller 306 each exhibit a certain degree of bidirectional functionality. Specifically, the CSO port and at least one pin of the D port of the input port controller 306 are configured to be bidirectional, thereby to allow commands to be back-propagated to slave device $104_{N-1}$ and other slave devices closer to the failed portion when approached from a first side. Similarly, in order to receive and process back-propagated responses from slave device $104_0$ and other slave devices closer to the failed portion from the other side, the CSI port and at least one pin of the Q port of the output port controller 304 are also configured to be bidirectional.

Additionally, and optionally, the DSI port can also be configured to be bidirectional so that the output port controller 304 can be alerted to the presence of data arriving from slave device $104_0$ on the bidirectional pin(s) of the D port. Similarly, the DSO port can be configured to be bidirectional to allow the input port controller 306 to specify a time window during which it would like to see slave device $104_{N-1}$ back-propagate data to the next upstream device on the bidirectional pin(s) of the $D_{N-1}$ port.

Let it now be assumed that the slave devices $104_{0 \ldots N-1}$ are all in the normal mode of operation. This means that the switching element 212 in each of the slave devices $104_j$ ($0 \leq j \leq N-1$) is configured to route data output from the respective information storage medium 208 onto the respective $Q_j$ port via the first switching element output port 216. Assume also that the master device 102 wishes to communicate with one or more "target" devices in the configuration of series-connected semiconductor devices. This is done by the master device 102 issuing a command destined for the target device(s). The command identifies the target device(s), which can be one or more slave devices $104_{0 \ldots N-1}$ in the configuration of series-connected semiconductor devices.

In a non-limiting embodiment, commands may be issued in the form of packets which form a higher-layer protocol of communication between the master device 102 and the slave devices $104_{0 \ldots N-1}$. Non-limiting examples of a command that can be processed by slave device $104_j$ ($0 \leq j \leq N-1$) while in the normal mode of operation include:

a READ command;
a WRITE command;
a WRITE CONFIGURATION REGISTER command.

There will now be provided some detail, in accordance with some examples, regarding the generation and effect of the above commands.

Read Command

The READ command, which is destined for a specific target device, is issued by the output port controller 304 and is encoded into the master serial output information signal $S_Q$ sent over the Q port. The output port controller 304 also ensures that the master command strobe signal $S_{CSI}$ is asserted while the master serial output information signal $S_Q$ is being transmitted.

Having passed through zero or more other slave devices further upstream, the READ command reaches slave device $104_j$ at the latter's $D_j$ port in the form of the serial input information signal $S_{D-j}$, and the accompanying master command strobe signal $S_{CSI}$ is received by slave device $104_j$ at the latter's $CSI_j$ port in the form of the command strobe signal $S_{CSI-j}$. As will now be shown, the received READ command is interpreted by the control module 206 and translated into control signals fed to various elements of the information storage medium 208 and other circuitry (not shown) of slave device $104_j$.

In a non-limiting example embodiment, the READ command may have the following encoded format. Of course, other formats for the READ command are possible, including a variety of other encoding schemes, arrangements of bits, and so on, without departing from the scope of the present invention.

| 1st segment | 2nd segment | 3rd segment |
|---|---|---|
| device address | B1h | read location |

The first segment of the READ command (device address) represents a hexadecimal or other value that is an address of the target device, which may or may not be slave device $104_j$ or another slave device in the configuration of series-connected semiconductor devices. Slave device $104_j$ becomes aware of its address during an initialization procedure, examples of which will be known to those skilled in the art. If the control module 206 indeed recognizes the address of slave device $104_j$ in the first segment of the received command, the control module 206 will enter a state where it becomes attentive to receipt of a further part of the received command requiring processing (noting that the control module 206 does not yet know that the received command is a READ command). Meanwhile, the control module 206 serially transfers the first segment of the received command out onto the $Q_j$ port after $T_{IOL-j}$ clock cycles.

The second segment of the READ command represents a hexadecimal or other value (in this example, B1h) that indicates that the received command is indeed a READ command and not some other command. Of course, the precise value associated with the second segment of the READ command is a design parameter and does not have any significance in this example other than to serve an illustrative purpose. By processing the second segment of the received command (under the assumption that the control module 206 has determined from the first segment of the command that it is indeed destined for slave device $104_j$), the control module 206 recognizes the received command as a READ command and will therefore enter a state where it becomes attentive to receipt of yet a further part of the command requiring processing. Meanwhile, the control module 206 serially transfers the second segment of the READ command (i.e., towards the next downstream device) out onto the $Q_j$ port after $T_{IOL-j}$ clock cycles.

The third segment of the READ command (read location) represents a hexadecimal or other value that specifies one or more memory locations in the information storage medium 208 whose contents are to be read and subsequently output onto the $Q_j$ port via the first switching element output port 216. Accordingly, the control module 206 accesses the contents of the one or more specified memory locations. Meanwhile, the control module 206 serially transfers the third segment of the READ command out onto the $Q_j$ port (i.e., towards the next downstream device) after $T_{IOL-j}$ clock cycles.

The data accessed in response to the READ command is to be placed onto the $Q_j$ port, but at a later time and in dependence upon the state of the data strobe signal $S_{DSI-j}$, which is a propagated version of the master data strobe signal $S_{DSI}$. Specifically, the master data strobe signal $S_{DSI}$ is asserted by the output port controller 304 after issuing the READ command as described above. The master data strobe signal $S_{DSI}$ is kept asserted for a suitable length of time commensurate with the amount of response data expected from the target device.

The master data strobe signal $S_{DSI}$ reaches slave device $104_j$ at the latter's $DSI_j$ port in the form of the data strobe signal $S_{DSI-j}$. Once the control module 206 detects that the data strobe signal $S_{DSI-j}$ has been asserted, the control module 206 places the data accessed from the information storage medium onto the $Q_j$ port via the first switching element output port 216 after a further $T_{IOL-j}$ clock cycles. However, if the data strobe signal $S_{DSI-j}$ signal is not asserted, the control module 206 does not feed any data to the switching element input port 214.

In view of the foregoing, it will be appreciated that the master device 102 issues a READ command to control the behavior of a target device in the configuration of series-connected semiconductor devices by using the D, CSI and DSI ports. The target device then responds to the READ command from the master device 102 and transmits response data further along the configuration of series-connected semiconductor devices. The response data is placed onto the $Q_j$ port of the target device during a time window of validity that is signaled by assertion of the data strobe signal $S_{DSI-j}$. The amount of time during which the data strobe signal $S_{DSI-j}$ remains asserted is related to the amount of data to be read from the information storage medium 208.

Since release of the response data by the target device follows detection by the target device that the data strobe signal $S_{DSI-j}$ received by the target device has been asserted, and since the data strobe signal $S_{DSI-j}$ corresponds to the master data strobe signal $S_{DSI}$ with a delay of $T_{IOL-j}$ at each upstream slave device in the configuration of series-connected semiconductor devices, it will be appreciated that release of the response data by the target device will be delayed relative to assertion of the master data strobe signal $S_{DSI}$ by the sum total of the flow-through latencies $T_{IOL-j}$ of each slave upstream from (and including) the target device. Thereafter, the response data will undergo a further delay of $T_{IOL-j}$ at each downstream device in the configuration of series-connected semiconductor devices. Thus, the response data appearing in the master serial input information signal $S_D$ will be delayed relative to assertion of the master data strobe signal $S_{DSI}$ by a total flow-through latency of the configuration of series-connected semiconductor devices, denoted $T_{IOL-TOTAL}$, where $T_{IOL-TOTAL} = \Sigma_j T_{IOL-j}$.

Ultimately, therefore, the master device 102 begins to receive the response data via its D port at an arrival time that will be delayed relative to assertion of the master data strobe signal $S_{DSI}$ by $T_{IOL-TOTAL}$. Although this arrival time may not apparent from the content of the master serial input information signal $S_D$ itself, it is apparent from the master data strobe echo signal $S_{DSO}$. Specifically, the master data strobe echo signal $S_{DSO}$ is a propagated version of the master data strobe signal $S_{DSI}$, and has undergone the same delay as the master serial input information signal $S_D$, corresponding to the total flow-through latency $T_{IOL-TOTAL}$. Thus, processing of the master data strobe echo signal $S_{DSO}$ can permit the master device 102 to extract valid response data from the master serial input information signal $S_D$.

Write Command

The WRITE command, which is destined for one or more target devices, is issued by the output port controller 304 and is encoded into the master serial output information signal $S_Q$ sent over the Q port. The output port controller 304 also ensures that the master command strobe signal $S_{CSI}$ is asserted while the master serial output information signal $S_Q$ is being transmitted.

Having passed through zero or more other slave devices further upstream, the WRITE command reaches slave device 104$_j$ at the latter's $D_j$ port in the form of the serial input information signal $S_{D-j}$, and the accompanying master command strobe signal $S_{CSI}$ is received by slave device 104$_j$ at the latter's $CSI_j$ port in the form of the command strobe signal $S_{CSI-j}$. As will now be shown, the received WRITE command is interpreted by the control module 206 and translated into control signals fed to various elements of the information storage medium 208 and other circuitry (not shown) of slave device 104$_j$.

In a non-limiting example embodiment, the WRITE command may have the following encoded format. Of course, other formats for the WRITE command are possible, including a variety of other encoding schemes, arrangements of bits, and so on, without departing from the scope of the present invention.

| 1$^{st}$ segment | 2$^{nd}$ segment | 3$^{rd}$ segment | 4$^{th}$ segment |
|---|---|---|---|
| device address | B0h | write location | DATA |

The first segment of the WRITE command (device address) represents a hexadecimal or other value that is an address of one target device (which may or may not be slave device 104$_j$) or an address representing a group of target devices (which may or may not include slave device 104$_j$. If the control module 206 indeed recognizes the address of slave device 104$_j$ in the first segment of the received command, the control module 206 will enter a state where it becomes attentive to receipt of a further part of the received command requiring processing (noting that the control module 206 does not yet know that the received command is a WRITE command). Meanwhile, the control module 206 serially transfers the first segment of the received command out onto the $Q_j$ port after $T_{IOL-j}$ clock cycles.

The second segment of the WRITE command represents a hexadecimal or other value (in this example, B0h) that indicates that the received command is indeed a WRITE command and not some other command. Of course, the precise value associated with the WRITE command is a design parameter and does not have any significance in this example other than to serve an illustrative purpose. By processing the second segment of the received command (under the assumption that the control module 206 has determined from the first segment of the command that it is indeed destined for slave device 104$_j$), the control module 206 recognizes the received command as a WRITE command and will therefore enter a state where it becomes attentive to receipt of yet a further part of the command requiring processing. Meanwhile, the control module 206 serially transfers the second segment of the WRITE command out onto the $Q_j$ port after $T_{IOL-j}$ clock cycles.

The third segment of the WRITE command (write location) represents a hexadecimal or other value that specifies one or more memory locations in the information storage medium 208 whose contents are to be written to with data appearing in one or more subsequent bytes of the WRITE command. These memory locations could be specified in terms of their beginning and end, or in terms of their beginning and length, or in any number of different ways. The control module 206 records these one or more memory locations and prepares itself for the receipt of yet a further segment of the write command. Meanwhile, the control module 206 serially transfers the third segment of the WRITE command out onto the $Q_j$ port after $T_{IOL-j}$ clock cycles.

The fourth segment of the WRITE command (DATA) represents hexadecimal or other values to be written to the one or more memory locations identified in the third segment of the WRITE command. Thus, there could be a small or large number of bytes contained in the fourth segment of the WRITE command. The control module 206 responds by transferring the received data into the information storage medium 208. Meanwhile, the control module 206 serially transfers the fourth segment of the WRITE command out onto the $Q_j$ port after $T_{IOL-j}$ clock cycles.

Write Configuration Register Command

The WRITE CONFIGURATION REGISTER ("WCR") command is destined for one or more target devices while in the normal mode of operation and can be used to cause the target device(s) to enter into the recovery mode of operation by writing to the configuration register 210. Accordingly, the WCR command is used once a failure has been detected and therefore with the knowledge the target device(s) is (are) each reachable exclusively via the output port controller 304 or exclusively via the input port controller 306.

It is noted that the master device 102 sends the WCR command in both directions around the configuration of series-connected semiconductor devices, not knowing how many slave devices are reachable from the output port controller 304 nor how many slave devices are reachable from the input port controller 306.

As such, in one direction around the configuration of series-connected semiconductor devices, the WCR command can be issued by the output port controller 304 and is encoded into the master serial output information signal $S_Q$ sent over the Q port. The output port controller 304 also ensures that the master command strobe signal $S_{CSI}$ is asserted while the master serial output information signal $S_Q$ is being transmitted. Having passed through zero or more other slave devices further upstream, the WCR command reaches slave device $104_j$ at the latter's $D_j$ port in the form of the serial input information signal $S_{D-j}$, and the accompanying master command strobe signal $S_{CSI}$ is received by slave device $104_j$ at the latter's $CSI_j$ port in the form of the command strobe signal $S_{CSI-j}$.

In the other direction around the configuration of series-connected semiconductor devices, the WCR command can be issued by the input port controller 306 and is encoded into the master serial input information signal $S_D$ sent over the bidirectional pin(s) of the D port. The input port controller 306 also ensures that the master serial echo signal $S_{CSO}$ is asserted while the master serial input information signal $S_D$ is being transmitted. Having passed through zero or more other slave devices further downstream, the WCR command reaches slave device $104_j$ at the bidirectional pin(s) of the latter's $Q_j$ port in the form of the serial output information signal $S_{Q-j}$, and the accompanying master command strobe echo signal $S_{CSO}$ is received by slave device 104 at the latter's bidirectional CSO, port in the form of the command strobe echo signal $S_{CSO-j}$.

The received WCR command is in each case interpreted by suitable circuitry in the control module 206 of slave device $104_j$ and translated into control signals fed to various elements of the information storage medium 208 and other circuitry (not shown) of slave device $104_j$. In a non-limiting example embodiment, the WCR command may have the following encoded format:

| 1st segment | 2nd segment | 3rd segment |
|---|---|---|
| device address | B2h | DATA |

Of course, other formats for the WCR command are possible, including a variety of other encoding schemes, arrangements of bits, and so on, without departing from the scope of the present invention. For example, the control module 206 may implement a decompression algorithm for decompressing compressed bit patterns associated with respective commands that may be potentially received. Thus, the above example WCR command may be compressed by the master device 102 in a loss-less fashion using any of a number of available coding algorithms (e.g., Lempel-Ziv, Huffman, etc.) into a smaller number of bits that do not necessarily have the above segment-by-segment breakdown.

Returning now to the above example format, the first segment of the WCR command (device address) represents a hexadecimal or other value that is an address of one target device (which may or may not be slave device $104_j$) or an address representing a group of target devices (which may or may not include slave device $104_j$). If the control module 206 indeed recognizes the address of slave device $104_j$ in the first segment of the received command, the control module 206 will enter a state where it becomes attentive to receipt of a further part of the received command requiring processing (noting that the control module 206 does not yet know that the received command is a WCR command).

Meanwhile, in the case where the first segment of the WCR command was received at the $D_j$ port, the control module 206 serially transfers the first segment of the received command out onto the $Q_j$ port (i.e., towards the next downstream device) after $T_{IOL-j}$ clock cycles. Conversely, if the first segment of the WCR command was received at the $Q_j$ port, the control module 206 serially transfers the first segment of the received command out onto the $D_j$ port (i.e., towards the next upstream device) after $T_{IOL-j}$ clock cycles.

The second segment of the WCR command represents a hexadecimal or other value (in this example, B2h) that indicates that the received command is indeed a WCR command and not some other command. Of course, the precise value associated with the WCR command is a design parameter and does not have any significance in this example other than to serve an illustrative purpose. By processing the second segment of the received command (under the assumption that the control module 206 has determined from the first segment of the command that it is indeed destined for slave device $104_j$), the control module 206 recognizes the received command as a WCR command and will therefore enter a state where it becomes attentive to receipt of yet a further part of the command requiring processing.

Meanwhile, in the case where the second segment of the WCR command was received at the $D_j$ port, the control module 206 serially transfers the second segment of the WCR command out onto the $Q_j$ port (i.e., towards the next downstream device) after $T_{IOL-j}$ clock cycles. Conversely, if the second segment of the WCR command was received at the bidirectional pin(s) of the $Q_j$ port, the control module 206 serially transfers the second segment of the WCR command out onto the bidirectional pin(s) of the $D_j$ port (i.e., towards the next upstream device) after $T_{IOL-j}$ clock cycles.

The third segment of the WCR command (DATA) represents a hexadecimal or other value to be written to the configuration register 210 of slave device $104_j$. The control module 206 responds by transferring the received data to the configuration register 210. By setting or toggling, for example, a specific bit in the configuration register 210, and with the control module 206 being made sensitive to changes in the configuration register 210, slave device $104_j$ can be triggered to enter into the recovery mode of operation.

Meanwhile, in the case where the third segment of the WCR command was received at the $D_j$ port, the control module 206 serially transfers the third segment of the WCR command out onto the $Q_j$ port (i.e., towards the next downstream device) after $T_{IOL-j}$ clock cycles. Conversely, if the third segment of the WCR command was received at the bidirectional pin(s) of the $Q_j$ port, the control module 206 serially transfers the third segment of the WCR command out onto the bidirectional pin(s) of the $D_j$ port (i.e., towards the next upstream device) after $T_{IOL-j}$ clock cycles.

Entry into the recovery mode of operation involves adopting a directionality, which varies depending on whether slave device $104_j$ is reachable from the output port controller 304 or from the input port controller 306. Specifically, if slave device $104_j$ is reachable from the output port controller 304, then slave device $104_j$ acts as a "fore branch" device. In order for slave device $104_j$ to operate in the recovery mode of operation as a fore branch device, the control module 206 configures itself for:

receipt of further commands from the output port controller 304 via the $CSI_j$ port and the $D_j$ port, and forwarding thereof to the next downstream device (no change from the normal mode of operation);

transmittal of data from the information storage medium 208 via the bidirectional pin(s) of the $D_j$ port, which involves issuance of a new select signal to the switching element select port 220 in order to cause the data at the switching element input port 214 to be sent to the second switching element output port 218;

attentiveness to data back-propagated from the next downstream device via the bidirectional pin(s) of the $Q_j$ port and forwarding thereof to the previous up stream device;

optionally: attentiveness to a data strobe signal back-propagated from the next downstream device via the $DSO_j$ port and forwarding thereof to the previous up stream device.

On the other hand, if slave device $104_j$ is reachable from the output port controller 306, then slave device $104_j$ acts as an "aft branch" device. In order for slave device $104_j$ to operate in the recovery mode of operation as an aft branch device, the control module 206 will configure itself for:

receipt of further commands from the output port controller 304 via the $CSO_j$ port and the $Q_j$ port, and back-propagation thereof to the previous upstream device;

transmittal of data from the information storage medium 208 via the $Q_j$ port (no change from the normal mode of operation);

attentiveness to data propagated from the previous upstream device via the $D_j$ port and forwarding thereof to the next downstream device (no change from the normal mode of operation);

optionally: attentiveness to a data strobe signal from the previous upstream device via the $DSI_j$ port and forwarding thereof to the next downstream device (no change from the normal mode of operation).

In order for control module 206 to determine whether it is in fact reachable from the output port controller 304 or from the input port controller 306 (and therefore to ascertain which directionality to adopt in the recovery mode of operation), a further bit may be written to the configuration register by way of the WCR command. Alternatively, the control module 206 can make this determination based on whether the WCR command was received from the $CSI_j$ and $D_j$ ports on the one hand, or from the $CSO_j$ and $Q_j$ ports on the other.

Let it now be assumed that certain ones of the slave devices $104_0 \ldots {}_{N-1}$ are in the recovery mode of operation. Specifically, let it be assumed that some of these devices are fore branch devices (which were reached via the output port controller 304) and that others of these devices are aft branch devices (which were reached via the input port controller 306). Assume also that the master device 102 wishes to communicate with one or more "target" devices that are in the recovery mode of operation, without assuming that the master device 102 initially knows whether to use the output port controller 304 or the input port controller 306 to reach a particular target device. To this end, communication is effected by the master device 102 issuing a command destined for the target device expected to be in the recovery mode of operation.

Non-limiting examples of a command that can be processed by slave device $104_j$ ($0 \leq j \leq N-1$) while in the recovery mode of operation include:

an IDENTIFICATION QUERY command;
    a SALVAGE command;
    a WRITE CONFIGURATION REGISTER-RECOVERY command;

There will now be provided some detail, in accordance with some examples, regarding the generation and effect of the above commands.

Identification Query Command

The IDENTIFICATION QUERY command can be used to cause a specific target device to identify itself while in the recovery mode of operation. Accordingly, in one direction, the IDENTIFICATION QUERY command can be issued by the output port controller 304 and is encoded into the master serial output information signal $S_Q$ sent over the Q port. The output port controller 304 also ensures that the master command strobe signal $S_{CSI}$ is asserted while the master serial output information signal $S_Q$ is being transmitted. Having passed through zero or more other slave devices further upstream, the IDENTIFICATION QUERY command reaches slave device $104_j$ at the latter's $D_j$ port in the form of the serial input information signal $S_{D-j}$, and the accompanying master command strobe signal $S_{CSI}$ is received by slave device $104_j$ at the latter's $CSI_j$ port in the form of the command strobe signal $S_{CSI-j}$.

In the other direction, the IDENTIFICATION QUERY command can be issued by the input port controller 306 and is encoded into the master serial input information signal $S_D$ sent over the bidirectional pin(s) of the D port. The input port controller 306 also ensures that the master serial echo signal $S_{CSO}$ is asserted while the master serial input information signal $S_D$ is being transmitted. Having passed through zero or more other slave devices further downstream, the IDENTIFICATION QUERY command reaches slave device $104_j$ at the bidirectional pin(s) of the latter's $Q_j$ port in the form of the serial output information signal $S_{Q-j}$, and the accompanying master echo signal $S_{CSO}$ is received by slave device $104_j$ at the latter's bidirectional $CSO_j$ port in the form of the command strobe echo signal $S_{CSO-j}$.

It is noted that the master device 102 sends the IDENTIFICATION QUERY command in both directions via both port controllers 304, 306, not knowing how many slave devices are reachable from the output port controller 304 or how many slave devices are reachable from the input port controller 306.

The received IDENTIFICATION QUERY command is in either case interpreted by suitable circuitry in the control module 206 of slave device $104_j$ and translated into control signals fed to various elements of the information storage medium 208 and other circuitry (not shown) of slave device $104_j$. In a non-limiting example embodiment, the IDENTIFICATION QUERY command may have the following encoded format. Of course, other formats for the IDENTIFICATION QUERY command are possible, including a variety of other encoding schemes, arrangements of bits, and so on, without departing from the scope of the present invention.

| $1^{st}$ segment | $2^{nd}$ segment |
| --- | --- |
| device address | B3h |

The first segment of the IDENTIFICATION QUERY command (device address) represents a hexadecimal or other value that is an address of the target device (which may or may not be slave device $104_j$). If the control module 206 indeed recognizes the address of slave device $104_j$ in the first segment of the received command, the control module 206 will enter a state where it becomes attentive to receipt of a further part of the received command requiring processing (noting that the control module 206 does not yet know that the received command is a IDENTIFICATION QUERY command).

Meanwhile, in the case where the first segment of the IDENTIFICATION QUERY command was received at the $D_j$ port, the control module 206 serially transfers the first segment of the received command out onto the $Q_j$ port after $T_{IOL-j}$ clock cycles. Conversely, if the first segment of the IDENTIFICATION QUERY command was received at the $Q_j$ port, the control module 206 serially transfers the first segment of the received command out onto the $D_j$ port after $T_{IOL-j}$ clock cycles.

The second segment of the IDENTIFICATION QUERY command represents a hexadecimal or other value (in this example, B3h) that indicates that the received command is indeed an IDENTIFICATION QUERY command and not some other command. Of course, the precise value associated with the IDENTIFICATION QUERY command is a design parameter and does not have any significance in this example other than to serve an illustrative purpose. By processing the second segment of the received command (under the assumption that the control module 206 has determined from the first segment of the command that it is indeed destined for slave device $104_j$), the control module 206 recognizes the received command as a IDENTIFICATION QUERY command, to which it will provide a specific response.

Meanwhile, in the case where the second segment of the IDENTIFICATION QUERY command was received at the $D_j$ port, the control module 206 serially transfers the second segment of the IDENTIFICATION QUERY command out onto the $Q_j$ port (i.e., towards the next downstream device) after $T_{IOL-j}$ clock cycles. Conversely, if the second segment of the IDENTIFICATION QUERY command was received at the $Q_j$ port, the control module 206 serially transfers the second segment of the IDENTIFICATION QUERY command out onto the $D_j$ port (i.e., towards the next upstream device) after $T_{IOL-j}$ clock cycles.

Referring now to the specific response provided by the control module 206, the IDENTIFICATION QUERY command causes slave device $104_j$ to provide an identification of itself. This can be done by the control module 206 obtaining an address of slave device $104_j$ which would have been learned in an initialization phase. The address of slave device $104_j$ may be stored in the configuration register 210 or elsewhere. In another embodiment, the mere fact that slave device $104_j$ responds to the IDENTIFICATION QUERY command may be considered a valid response, and therefore the control module 206 may simply generate any suitable code to identify itself.

The resulting "identification data" (i.e., the identity of slave device $104_j$ or a code) is then to be placed onto the $Q_j$ port or the bidirectional pin(s) of the $D_j$ port (depending on the directionality adopted by slave device $104_j$ for operation in the recovery mode of operation). In one embodiment, the identification data is placed on the appropriate port ($Q_j$ or $D_j$) at a later time that depends upon the state of the data strobe signal ($S_{DSI-j}$ or $S_{DSO-j}$), which is a propagated version of the master data strobe signal $S_{DSI}$ or the master data strobe echo signal $S_{DSO}$.

Specifically, in one direction, the master data strobe signal $S_{DSI}$ is asserted by the output port controller 304 after issuing the IDENTIFICATION QUERY command as described above. The master data strobe signal $S_{DSI}$ is kept asserted for a suitable length of time commensurate with the amount of response data expected from the target device. The master data strobe signal $S_{DSI}$ reaches slave device $104_j$ at the latter's $DSI_j$ port in the form of the data strobe signal $S_{DSI-j}$. Once the control module 206 detects that the data strobe signal $S_{DSI-j}$ has been asserted, the control module 206 places the identification data (i.e., the identity of slave device $104_j$ or a code) onto the $Q_j$ port after a further $T_{IOL-j}$ clock cycles.

In the other direction, the master data strobe echo signal $S_{DSO}$ is asserted by the input port controller 306 after issuing the IDENTIFICATION QUERY command as described above. The master data strobe echo signal $S_{DSO}$ is kept asserted for a suitable length of time commensurate with the amount of response data expected from the target device. The master data strobe echo signal $S_{DSO}$ reaches slave device $104_j$ at the latter's DSO, port in the form of the data strobe echo signal $S_{DSO-j}$. Once the control module 206 detects that the data strobe echo signal $S_{DSO-j}$ has been asserted, the control module 206 places the identification data (i.e., the identity of slave device $104_j$ or a code) onto the bidirectional pin(s) of the $D_j$ port after a further $T_{IOL-j}$ clock cycles.

It is also within the scope of the present invention for the identification data to be output onto the $Q_j$ port (or the bidirectional pin(s) of the $D_j$ port, as appropriate) without issuance of the master data strobe signal $S_{DSI}$ or the master data strobe echo signal $S_{DSO}$ by the master device 102.

Salvage Command

The SALVAGE command can be used to cause a specific target device to read data from the information storage medium 208 while in the recovery mode of operation. This may be effected during a salvage operation, where the computing system with which the master device 102 interacts decides to transfer data stored by still operable ones of the slave devices to an alternate memory facility.

It is noted that the master device knows whether the target device is reachable from the output port controller 304 (i.e., the target device is a fore branch device) or from the input port controller 306 (i.e., the target device is an aft branch device).

When the target device is a fore branch device, the SALVAGE command is issued by the output port controller 304 and is encoded into the master serial output information signal $S_Q$ sent over the Q port. The output port controller 304 also ensures that the master command strobe signal $S_{CSI}$ is asserted while the master serial output information signal $S_Q$ is being transmitted. The SALVAGE command reaches slave device $104_j$ at the latter's $D_j$ port in the form of the serial input information signal $S_{D-j}$, and the accompanying master command strobe signal $S_{CSI}$ is received by slave device $104_j$ at the latter's $CSI_j$ port in the form of the command strobe signal $S_{CSI-j}$.

When the target device is an aft branch device, the SALVAGE command is issued by the input port controller 306 and is encoded into the master serial input information signal $S_D$ sent over the bidirectional pin(s) of the D port. The input port controller 306 also ensures that the master serial echo signal $S_{CSO}$ is asserted while the master serial input information signal $S_D$ is being transmitted. The SALVAGE command reaches slave device $104_j$ at the bidirectional pin(s) of the latter's $Q_j$ port in the form of the serial output information signal $S_{Q-j}$, and the accompanying master command strobe echo signal $S_{CSO}$ is received by slave device $104_j$ at the latter's bidirectional CSO, port in the form of the command strobe echo signal $S_{CSO-j}$.

Irrespective of how it is received by slave device $104_j$, the SALVAGE command is interpreted by suitable circuitry in the control module 206 and translated into control signals fed to various elements of the information storage medium 208 and other circuitry (not shown) of slave device $104_j$. In a non-limiting example embodiment, the SALVAGE command may have the following encoded format. Of course, other formats for the SALVAGE command are possible, including a variety of other encoding schemes, arrangements of bits, and so on, without departing from the scope of the present invention.

| 1st segment | 2nd segment | 3rd segment |
| --- | --- | --- |
| device address | B4h | read location |

The first segment of the SALVAGE command (device address) represents a hexadecimal or other value that is an address of the target device (which may or may not be slave device $104_j$. If the control module 206 indeed recognizes the address of slave device $104_j$ in the first segment of a given received command, the control module 206 will enter a state where it becomes attentive to receipt of a further part of the received command requiring processing (noting that the control module 206 does not yet know that the received command is a SALVAGE command).

Meanwhile, in the case where the first segment of the SALVAGE command was received at the $D_j$ port, the control module 206 serially transfers the first segment of the received command out onto the $Q_j$ port after $T_{IOL-j}$ clock cycles. Conversely, if the first segment of the SALVAGE command was received at the $Q_j$ port, the control module 206 serially transfers the first segment of the received command out onto the $D_j$ port after $T_{IOL-j}$ clock cycles.

The second segment of the SALVAGE command represents a hexadecimal or other value (in this example, B4h) that indicates that the received command is indeed a SALVAGE command and not some other command. Of course, the precise value associated with the SALVAGE command is a design parameter and does not have any significance in this example other than to serve an illustrative purpose. By processing the second segment of the received command (under the assumption that the control module 206 has determined from the first segment of the command that it is indeed destined for slave device $104_j$), the control module 206 recognizes the received command as a SALVAGE command and will therefore enter a state where it becomes attentive to receipt of yet a further part of the command requiring processing.

Meanwhile, in the case where the second segment of the SALVAGE command was received at the $D_j$ port, the control module 206 serially transfers the second segment of the SALVAGE command out onto the $Q_j$ port (i.e., towards the next downstream device) after $T_{IOL-j}$ clock cycles. Conversely, if the second segment of the SALVAGE command was received at the $Q_j$ port, the control module 206 serially transfers the second segment of the SALVAGE command out onto the $D_j$ port (i.e., towards the next upstream device) after $T_{IOL-j}$ clock cycles.

The third segment of the SALVAGE command (read location) represents a hexadecimal or other value that specifies one or more memory locations in the information storage medium 208 whose contents are to be read while slave device $104_j$ is in the recovery mode of operation. Accordingly, the control module 206 accesses the contents of the one or more specified memory locations. Meanwhile, in the case where the third segment of the SALVAGE command was received at the $D_j$ port, the control module 206 serially transfers the third segment of the SALVAGE command out onto the $Q_j$ port (i.e., towards the next downstream device) after $T_{IOL-j}$ clock cycles. Conversely, if the third segment of the SALVAGE command was received at the $Q_j$ port, the control module 206 serially transfers the third segment of the SALVAGE command out onto the $D_j$ port (i.e., towards the next upstream device) after $T_{IOL-j}$ clock cycles.

The data accessed in response to the SALVAGE command is to be placed onto the Q port or the bidirectional pin(s) of the $D_j$ port (depending on the directionality adopted by slave device $104_j$ for operation in the recovery mode of operation). In one embodiment, the accessed data is only placed on the appropriate port ($Q_j$ or $D_j$) at a later time that depends upon the state of the data strobe signal ($S_{DSI-j}$ or $S_{DSO-j}$), which is a propagated version of the master data strobe signal $S_{DSI}$ or the master data strobe echo signal $S_{DSO}$.

Specifically, in one direction, the master data strobe signal $S_{DSI}$ is asserted by the output port controller 304 after issuing the SALVAGE command as described above. The master data strobe signal $S_{DSI}$ is kept asserted for a suitable length of time commensurate with the amount of response data expected from the target device. The master data strobe signal $S_{DSI}$ reaches slave device $104_j$ at the latter's $DSI_j$ port in the form of the data strobe signal $S_{DSI-j}$. Once the control module 206 detects that the data strobe signal $S_{DSI-j}$ has been asserted, the control module 206 places the data accessed from the information storage medium 208 onto the $Q_j$ port via the first switching element output port 216 after a further $T_{IOL-j}$ clock cycles. However, if the data strobe signal $S_{DSI-j}$ signal is not asserted, the control module 206 does not feed any data to the switching element input port 214.

In the other direction, the master data strobe echo signal $S_{DSO}$ is asserted by the input port controller 306 after issuing the SALVAGE command as described above. The master data strobe echo signal $S_{DSO}$ is kept asserted for a suitable length of time commensurate with the amount of response data expected from the target device. The master echo signal $S_{DSO}$ reaches slave device $104_j$ at the latter's $DSO_j$ port in the form of the data strobe echo signal $S_{DSO-j}$. Once the control module 206 detects that the data strobe echo signal $S_{DSO-j}$ has been asserted, the control module 206 places the data accessed from the information storage medium 208 onto the bidirectional pin(s) of the $D_j$ port via the second switching element output port 218 after a further $T_{IOL-j}$ clock cycles. However, if the data strobe signal $S_{DSI-j}$ signal is not asserted, the control module 206 does not feed any data to the switching element input port 214.

It is also within the scope of the present invention for the accessed data to be output onto the $Q_j$ port (or the bidirectional pin(s) of the $D_j$ port, as appropriate) without issuance of the master data strobe signal $S_{DSI}$ or the master data strobe echo signal $S_{DSO}$ by the master device 102.

Write Configuration Register-Recovery Command

The WRITE CONFIGURATION REGISTER-RECOVERY ("WCR-R") command is destined for one or more target devices while in the recovery mode of operation and can be used to cause the target device(s) to re-enter into the normal mode of operation by writing to the configuration register 210. Accordingly, the WCR-R command can be used once the computing system with which the master device 102 interacts is satisfied that the failed portion of the configuration of series-connected semiconductor devices has been repaired and that the target device(s) may now re-enter into the normal mode of operation. It is noted that the possible re-entry into the normal mode of operation implies that the target device(s) is (are) reachable via both the output port controller 304 and the input port controller 306. Thus, the WCR-R command can be sent from either the output port controller 304 or the input port controller 306.

If the WCR-R command is issued by the output port controller 304, it can be encoded into the master serial output information signal $S_Q$ sent over the Q port. The output port controller 304 also ensures that the master command strobe signal $S_{CSI}$ is asserted while the master serial output information signal $S_Q$ is being transmitted. The WCR-R command reaches slave device $104_j$ at the latter's $D_j$ port in the form of the serial input information signal $S_{D-j}$, and the accompanying master command strobe signal $S_{CSI}$ is received by slave device $104_j$ at the latter's $CSI_j$ port in the form of the command strobe signal $S_{CSI-j}$.

On the other hand, if the WCR-R command is issued by the input port controller 306, it can be encoded into the master serial input information signal $S_D$ sent over the bidirectional pin(s) of the D port. The input port controller 306 also ensures that the master command strobe echo signal $S_{CSO}$ is asserted while the master serial input information signal $S_D$ is being transmitted. The WCR-R command reaches slave device 104 at the bidirectional pin(s) of the latter's $Q_j$ port in the form of the serial output information signal $S_{Q-j}$, and the accompanying master command strobe echo signal $S_{CSO}$ is received by slave device $104_j$ at the latter's $CSO_j$ port in the form of the command strobe echo signal $S_{CSO-j}$.

The received WCR-R command is interpreted by suitable circuitry in the control module 206 of slave device $104_j$ and translated into control signals fed to various elements of the information storage medium 208 and other circuitry (not shown) of slave device $104_j$. In a non-limiting example embodiment, the WCR-R command may have the following encoded format. Of course, other formats for the WCR-R command are possible, including a variety of other encoding schemes, arrangements of bits, and so on, without departing from the scope of the present invention.

| 1$^{st}$ segment | 2$^{nd}$ segment | 3$^{rd}$ segment |
|---|---|---|
| device address | B5h | DATA |

The first segment of the WCR-R command (device address) represents a hexadecimal or other value that is an address of one target device (which may or may not be slave device $104_j$) or an address representing a group of target devices (which may or may not include slave device $104_j$). If the control module 206 indeed recognizes the address of slave device $104_j$ in the first segment of the received command, the control module 206 will enter a state where it becomes attentive to receipt of a further part of the received command requiring processing (noting that the control module 206 does not yet know that the received command is a WCR-R command).

Meanwhile, in the case where the first segment of the WCR-R command was received at the $D_j$ port, the control module 206 serially transfers the first segment of the received command out onto the $Q_j$ port (i.e., towards the next downstream device) after $T_{IOL-j}$ clock cycles. Conversely, if the first segment of the WCR-R command was received at the $Q_j$ port, the control module 206 serially transfers the first segment of the received command out onto the $D_j$ port (i.e., towards the next upstream device) after $T_{IOL-j}$ clock cycles.

The second segment of the WCR-R command represents a hexadecimal or other value (in this example, B5h) that indicates that the received command is indeed a WCR-R command and not some other command. Of course, the precise value associated with the WCR-R command is a design parameter and does not have any significance in this example other than to serve an illustrative purpose. By processing the second segment of the received command (under the assumption that the control module 206 has determined from the first segment of the command that it is indeed destined for slave device $104_j$), the control module 206 recognizes the received command as a WCR-R command and will therefore enter a state where it becomes attentive to receipt of yet a further part of the command requiring processing.

Meanwhile, in the case where the second segment of the WCR-R command was received at the $D_j$ port, the control module 206 serially transfers the second segment of the WCR-R command out onto the $Q_j$ port (i.e., towards the next downstream device) after $T_{IOL-j}$ clock cycles. Conversely, if the second segment of the WCR-R command was received at the bidirectional pin(s) of the $Q_j$ port, the control module 206 serially transfers the second segment of the WCR-R command out onto the bidirectional pin(s) of the $D_j$ port (i.e., towards the next upstream device) after $T_{IOL-j}$ clock cycles.

The third segment of the WCR-R command (DATA) represents a hexadecimal or other value to be written to the configuration register 210 of slave device $104_j$. The control module 206 responds by transferring the received data to the configuration register 210. By setting or toggling a specific bit in the configuration register 210, and with the control module 206 being made sensitive to changes in the configuration register 210, slave device $104_j$ can be triggered to re-enter into the normal mode of operation.

Meanwhile, in the case where the third segment of the WCR-R command was received at the $D_j$ port, the control module 206 serially transfers the third segment of the WCR-R command out onto the $Q_j$ port (i.e., towards the next downstream device) after $T_{IOL-j}$ clock cycles. Conversely, if the third segment of the WCR-R command was received at the bidirectional pin(s) of the $Q_j$ port, the control module 206 serially transfers the third segment of the WCR-R command out onto the bidirectional pin(s) of the $D_j$ port (i.e., towards the next upstream device) after $T_{IOL-j}$ clock cycles.

Figure 4:
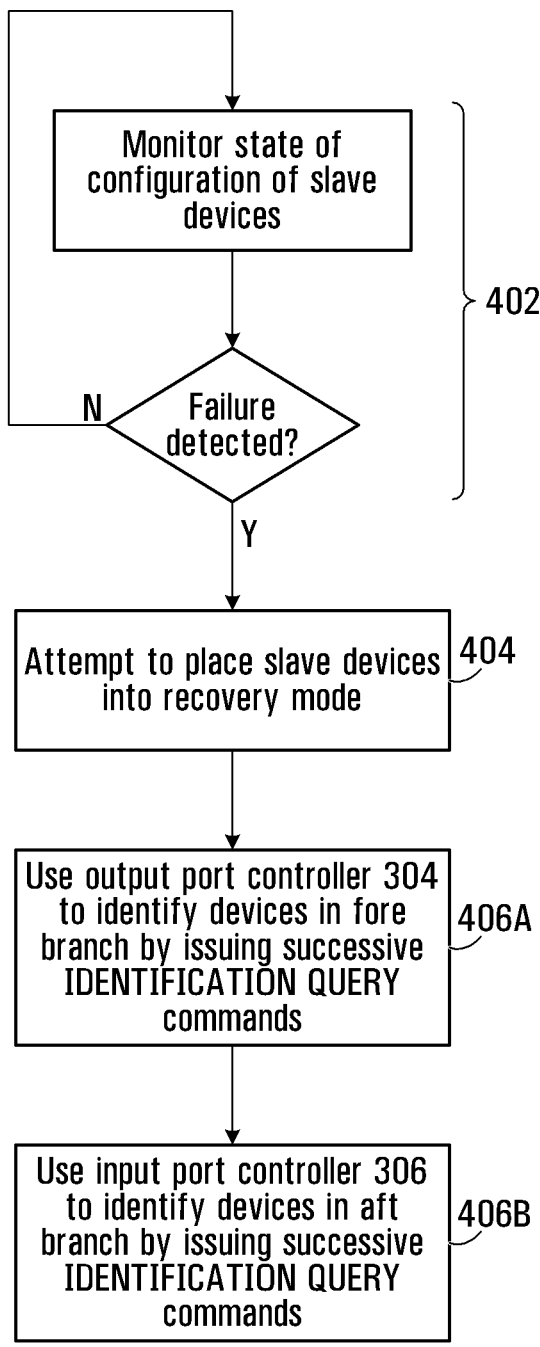
FIG. 4 is a flowchart showing steps in a failure detection and isolation function implemented by the master device, in accordance with a non-limiting embodiment.

With reference now to the flowchart in FIG. 4, in one embodiment, the master device 102 (or the computing system with which the master device 102 interacts) executes a failure detection and isolation function. The failure detection and isolation function begins at step 402 by monitoring the state of the configuration of series-connected semiconductor devices in an attempt to detect a failure. Monitoring the state of the configuration of series-connected semiconductor devices may comprise monitoring response times from commands sent into the configuration of series-connected semiconductor devices.

In one specific non-limiting example embodiment, commands issued by the output port controller 304 are monitored. Specifically, the commands are encoded into the master serial output information signal $S_Q$ sent over the Q port. The master command strobe signal $S_{CSI}$ is asserted while the master serial output information signal $S_Q$ is being transmitted, and is then de-asserted. The master device 102 thus knows the instant at which the master command strobe signal $S_{CSI}$ was asserted and de-asserted. Moreover, the master device 102 knows the flow-through latency $T_{IOL-TOTAL}$ of the configuration of series-connected semiconductor devices. Thus, the master device 102 can monitor whether a command that is issued by the output port controller 304 returns via the D port of the input port controller 306 with an expected delay of $T_{IOL-TOTAL}$ seconds following its issuance. Specifically, the returned command is expected to begin with a delay of $T_{IOL-TOTAL}$ following assertion of the master command strobe signal $S_{CSI}$ and is expected to end with a delay of $T_{IOL-TOTAL}$ seconds following de-assertion of the master command strobe signal $S_{CSI}$ (or, equivalently, a delay of $T_{IOL-TOTAL}+L_{CMD}$ seconds following assertion of the master command strobe signal $S_{CSI}$, where $L_{CMD}$ is the length of the command, which can be known or measured). If the command does not return with the expected delay (or does not return at all), then the configuration of series-connected semiconductor devices can be deemed impaired, thus proceeding to the remaining steps.

Assume now that at some point, the master device 102 indeed detects that the configuration of series-connected semiconductor devices is impaired. Let this be due to a failure between an anomalous (e.g., failed) slave device $104_K$ (which defines a fore branch consisting of slave devices $104_{0 \ldots K-1}$) and an anomalous (e.g., failed) slave device $104_M$ (K<M, which defines an aft branch consisting of slave devices $104_{M+1 \ldots K-1}$). It is noted that the master device 102 does not yet know the values K or M, and that identification of K and M is one outcome of the failure detection and isolation function.

The master device 102 then proceeds to execute step 404, where one or more of the slave devices $104_p$ ($0 \leq p < K$, or $M < p \leq N-1$, where K and M are still unknown to the master device 102) are placed into the recovery mode of operation. Specifically, an attempt can be made to broadcast the previously described WCR command to all the slave devices $104_{0 \ldots N-1}$ via the output port controller 304 and the input port controller 306. Alternatively, an attempt can be made to send the WCR command to all the slave devices $104_{0 \ldots N-1}$ on a one-by-one basis. As described above, the various operable slave devices $104_p$ ($0 \leq p < K$, or $M < p \leq N-1$) will be triggered to enter into the recovery mode of operation.

Next, with slave devices $104_p$ ($0 \leq p < K$, or $M < p \leq N-1$) in the recovery mode of operation, the master device 102 executes steps 406A and 406B, by virtue of which the slave devices $104_K$ and $104_M$, respectively, can be identified. Specifically, step 406A can be performed in accordance with the following non-limiting example pseudocode listing of sub-steps:

a) select j=0;
b) send IDENTIFICATION QUERY command destined for slave device $104_j$ using the output port controller 304 (i.e., over the CSI port and the Q port);
c) be attentive to receipt of identification data over the bidirectional pin(s) of the Q port;
d) if identification data received and allows the responding slave device to be identified as slave device $104_j$, increment j and repeat a) through c); otherwise, conclude that K=j.

It is noted that if it is in the recovery mode of operation (which means that it is still operable), each successive slave device $104_j$ will respond in the manner previously described between sub-steps b) and c) above. Otherwise, slave device $104_j$ is not operable will not respond, nor will it be able to back-propagate a response received from a device further downstream. Thus, if no response is received while j has a particular value, it can be inferred that the slave device with which the master device 102 is trying to communicate (i.e., slave device $104_j$) is located at the "fore" edge of the failure, and therefore K is equal to this particular value of j.

Analogously, step 406B can be performed in accordance with the following non-limiting example pseudocode listing of sub-steps:

a) select j=N-1;
b) send IDENTIFICATION QUERY command destined for slave device $104_j$ using the input port controller 306 (i.e., over the CSO port and the bidirectional pin(s) of the D port);
c) be attentive to receipt of identification data over the D port;
d) if identification data received and allows the responding slave device to be identified as slave device 104, decrement j and repeat sub-steps a) through c); otherwise, conclude that M=j.

It is noted that if it is in the recovery mode of operation (which means that it is still operable), each successive slave device $104_j$ will respond in the manner previously described between sub-steps b) and c) above. Otherwise, slave device $104_j$ is not operable will not respond, nor will it be able to propagate a response received from a device further upstream. Thus, if no response is received while j has a particular value, it can be inferred that the slave device with which the master device 102 is trying to communicate (i.e., slave device $104_j$) is located at the "aft" edge of the failure, and therefore M is equal to this particular value of j.

It should be noted that if K ever equals, or surpasses, M, this implies that all of the slave devices can be reached by the master device 102 from at least one direction.

It should be appreciated that variations of the above method can be made without departing from the scope of the present invention. For example, it is contemplated that the WCR and IDENTIFICATION QUERY commands may be combined into a single command that is sent to each of the slave devices, successively, from either end of the configuration of series-connected semiconductor devices.

Figure 5:
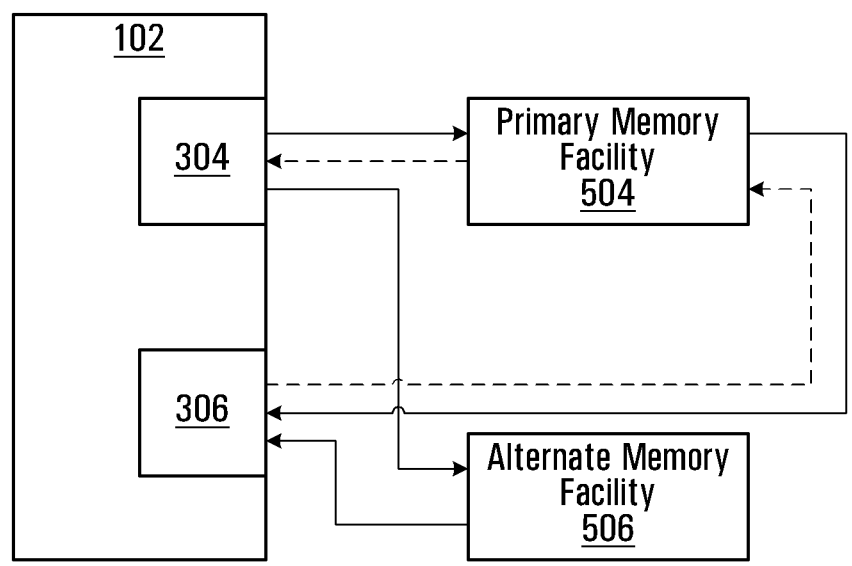
FIG. 5 is a block diagram of a system comprising the master device of FIG. 1 operatively coupled to a primary memory facility and an alternate memory facility, in accordance with a non-limiting embodiment.

Reference is now made to FIG. 5, where the master device 102 (or the computing system with which it interacts) is used in an architecture where the master device 102 is provided with access to a primary memory facility 504 and an alternate memory facility 506. Such an architecture may be particularly applicable in redundant data storage applications, such as RAID (Redundant Array or Independent Drives (or Disks)) schemes that divide and/or replicate data among multiple hard drives. As is known to those skilled in the art, a RAID architecture can be designed to provide increased data reliability or input/output performance. Thus, the primary and alternate memory facilities 504, 506 may correspond to respective hard drives in a RAID architecture. However, the context of a RAID architecture is merely an example, and corresponds to but one of a myriad of practical applications of the system of FIG. 5.

In accordance with an example embodiment, the primary memory facility 504 includes a configuration of series-connected semiconductor devices, such as slave devices $104_{0 \ldots N-1}$. The alternate memory facility 506 can be a second configuration of series-connected semiconductor devices, or any other memory system, including but not limited to a conventional memory architecture. In accordance with a specific non-limiting embodiment, the master device 102 is capable of executing a recovery function. In the illustrated embodiment, access to the alternate memory facility 506 is via the output port controller 304 and the input port controller 306. However, in other embodiments, access to the alternate memory facility 506 may be via other elements of the master device 102 or the computing system with which it interacts.

The recovery function involves retrieving data from one or more of the operable slave devices $104_p$ ($0 \leq p < K$, or $M < p \leq N-1$) on either side of a previously identified failed portion of the primary memory facility 504. It is assumed that at least one such operable device exists. In addition, the recovery function involves placing the retrieved data in the alternate memory facility 504. By way of non-limiting example, the operable slave devices $104_p$ ($0 \leq p < K$, or $M < p \leq N-1$) may be identified using the previously described fault detection and isolation function.

Figure 6:
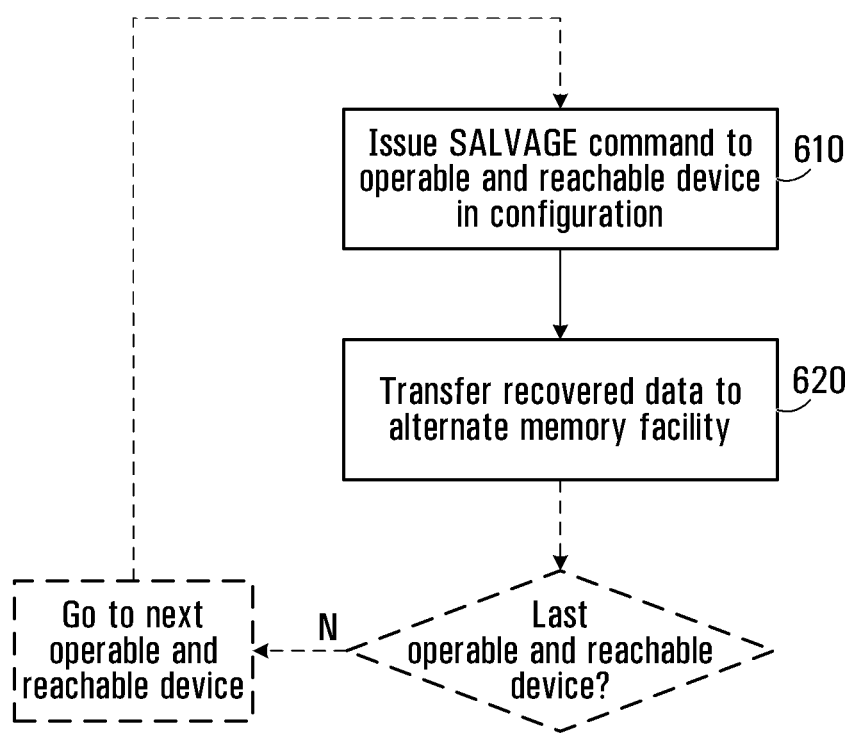
FIG. 6 is a flowchart showing steps in a recovery function implemented by the master device of FIG. 5, in accordance with a non-limiting embodiment.

With reference to the flowchart in FIG. 6, the master device 102 proceeds to step 610, where the master device 102 issues a SALVAGE command to each of the operable slave devices $104_p$ ($0 \leq p < K$, or $M < p \leq N-1$) in successive fashion. Operation of the slave devices $104_p$ ($0 \leq p < K$, or $M < p \leq N-1$) is as previously described, and involves the transmission of data over one or more bidirectional pins. Accordingly, recovered data is received from the slave devices $104_p$ ($0 \leq p < K$) over the bidirectional pin(s) of the D port of the output port controller 304.

Similarly, recovered data is received from the slave devices $104_p$ ($M<p\leq N-1$) over the bidirectional pin(s) of the Q port of the input port controller 306.

At step 620, the master device 102 places the recovered data can be placed in the alternate memory facility 506. It should be appreciated that the recovered data can be placed in the alternate memory facility 506 as it is retrieved from each of the slave devices $104_p$ ($0\leq p<K$, or $M<p\leq N-1$), or the recovered data from the slave devices $104_p$ ($0\leq p<K$, or $M<p\leq N-1$) can be temporarily buffered by the master device 102 and then placed in bulk in the alternate memory facility 506.

It should be appreciated that the use of bidirectional pins and ports allows data to be transferred out of the slave devices $104_p$ ($0\leq p<K$, or $M<p\leq N-1$) even where there is a portion of the configuration of series-connected semiconductor devices (namely, between slave device $104_K$ and $104_M$, inclusively) that has failed. The rate at which recovered data can be transferred back through the master device 102 depends on the number of bidirectional pins on the $D_j$ and $Q_j$ ports. However, those skilled in the art will recognize that an increased data transfer rate obtained from usage of a greater number of bidirectional pins needs to be traded off against the resultant cost of the slave devices. Thus, it is possible that a particular slave device $104_p$ may have a maximum rate of data transfer during operation in the recovery mode of operation that is lower than a maximum rate of data transfer during the normal mode of operation.

It should also be understood that many variants that would now appear to those of ordinary skill in the art, and these variants are contemplated as remaining within the scope of the present invention. These include variants based on changes in clock rate type (e.g., single data rate (SDR), double data rate (DDR), quad data rate (QDR), octal data rate (ODR), graphics double data rate (GDDR)), clock response type (e.g., source-synchronous, center-aligned), signal level mode (e.g., single-ended, differential), the number of slave devices in the interconnection, voltage supply levels, whether a signal is considered active when high or when low, and various other functional characteristics. There is also no limitation on the types of slave devices that may be interconnected or on the number of different types of devices connected in the same configuration of series-connected semiconductor devices.

Persons skilled in the art should also appreciate that embodiments of the present invention can be used in conjunction with other innovations relating to arrangements of serially interconnected semiconductor devices. Furthermore, it should be understood that certain combinations of some example embodiments with certain other innovations, the combining of which would only be apparent through juxtaposed reading of disclosures, may result in further innovations which are not herein dedicated to the public. Examples of such other innovations can be found in various patent applications, a non-limiting set of which includes:

Ser. No. 60/722,368, filed Sep. 30, 2005;
Ser. No. 11/324,023, filed Dec. 30, 2005;
Ser. No. 11/496,278, filed Jul. 31, 2006;
Ser. No. 11/521,734, filed Sep. 15, 2006;
Ser. No. 11/606,407, filed Nov. 29, 2006;
Ser. No. 11/771,023 filed Jun. 29, 2007; and
Ser. No. 11/771,241 filed Jun. 29, 2007.

Moreover, where components and circuitry of the various devices have been illustrated as being directly connected to one another, one should appreciate that this has been done for the sake of simplicity and that other components and circuitry may be placed therebetween or coupled thereto without departing from the scope of the invention. As a result, what appear to be direct connections in the drawings may in fact be implemented as indirect connections in an actual realization.

It should also be apparent to those of ordinary skill in the art that the operations and functions of certain ones of the above-described controllers, control modules and other elements may be achieved by hardware or software. Specifically, these operations and functions may be achieved using a computing apparatus that has access to a code memory (not shown) which stores computer-readable program code for operation of the computing apparatus, in which case the computer-readable program code could be stored on a medium which is fixed, tangible and readable directly by the controller, control module or other element in question, or the computer-readable program code could be stored remotely but transmittable to the device in question via a modem or other interface device connected to a network (including, without limitation, the Internet) over a transmission medium, which may be either a non-wireless medium (e.g., optical or analog communications lines) or a wireless medium (e.g., microwave, infrared or other transmission schemes) or a combination thereof.

While specific embodiments of the present invention have been described and illustrated, it will be apparent to those skilled in the art that numerous modifications and variations can be made without departing from the scope of the present invention as defined in the appended claims.

What is claimed is:

1. A method of recovering data from a configuration of series-connected semiconductor memory devices having undergone a failure, the method comprising:
    placing an operable device of the configuration into a recovery mode of operation, the operable device not being a failed device of the configuration;
    while the operable device is in the recovery mode of operation, retrieving data currently stored by the operable device; and
    storing the retrieved data in an alternate memory facility.

2. The method defined in claim 1, wherein placing the operable device into the recovery mode of operation comprises sending a command to the operable device.

3. The method defined in claim 2, wherein said command specifically identifies the operable device as an intended recipient of the command.

4. The method defined in claim 2, wherein said command is a broadcast command having plural intended recipients including the operable device.

5. The method defined in claim 2, further comprising monitoring the configuration of series-connected semiconductor devices, wherein said command is sent in response to said monitoring being indicative of the configuration of series-connected semiconductor devices having undergone a failure.

6. The method defined in claim 1, wherein retrieving data currently stored by the operable device comprises sending a command to the operable device, thereby to cause the operable device to respond by returning data currently stored by the operable device.

7. The method defined in claim 6, wherein sending the command to the operable device is effected over a port used for downstream transmissions to the operable device while in a normal mode of operation, and wherein the retrieved data is received over at least one bidirectional pin of said port.

8. The method defined in claim 6, wherein sending the command to the operable device is effected over at least one bidirectional pin of a port used for receiving downstream transmissions from the operable device while in a normal mode of operation, and wherein the retrieved data is received over said port.

9. The method defined in claim 1, further comprising:
placing at least one other operable device of the configuration into the recovery mode of operation;
while the at least one other operable device is in the recovery mode of operation, retrieving data currently stored by the at least one other operable device; and
storing the retrieved data in the alternate memory facility.

10. A non-transitory computer-readable medium comprising computer-readable program code which, when interpreted by a controller, causes the controller to execute a method of recovering data from a configuration of series-connected semiconductor memory devices having undergone a failure, the computer-readable program code comprising: first computer-readable program code for causing the controller to place an operable device of the configuration into a recovery mode of operation, the operable device not being a failed device of the configuration; second computer-readable program code for causing the controller to retrieve data currently stored by the operable device while the operable device is in the recovery mode of operation; and third computer-readable program code for causing the controller to store the retrieved data in an alternate memory facility.

11. A system, comprising:
a configuration of series-connected semiconductor memory devices;
an alternate memory facility; and
a controller electrically connected to the configuration of series-connected semiconductor memory devices and to the alternate memory facility, the controller configured for:
issuing a particular command to place an operable device of the configuration of series-connected semiconductor memory devices into a recovery mode of operation, the operable device not being a failed device of the configuration;
while the operable device is in the recovery mode of operation, retrieving data currently stored by the operable device; and
storing the retrieved data in the alternate memory facility.

12. The system defined in claim 11, the configuration of series-connected semiconductor memory devices having an input end and an output end, wherein the controller comprises:
a plurality of output ports electrically connected to input ports of a device at the input end of the configuration of series-connected semiconductor memory devices;
an output port controller configured for sending data and commands to the configuration of series-connected semiconductor memory devices over the output ports of the controller during a normal mode of operation;
a plurality of input ports electrically connected to output ports of a device at the output end of the serial connection; and
an input port controller configured for receiving data and commands from the configuration of series-connected semiconductor memory devices over the input ports of the controller during the normal mode of operation.

13. The system defined in claim 12, wherein the output port controller is further configured for sending said particular command to the operable device over one of the output ports, and wherein the output port controller is configured for receiving the retrieved data over at least one bidirectional pin of one of the output ports.

14. The system defined in claim 12, wherein the input port controller is further configured for sending said particular command to the operable device over at least one bidirectional pin of one of the input ports, and wherein the input port controller is further configured for receiving the retrieved data over at least one of the input ports.

15. The system defined in claim 11, wherein the operable device comprises:
an interface comprising a plurality of input ports and a plurality of output ports;
an information storage medium;
a control module configured to cause information to be stored in, or retrieved from, the information storage medium, the control module further configured to receive commands and data from the controller over the input ports in a downstream direction while in a normal mode of operation, the control module further configured to send commands and data to the controller over the output ports in the downstream direction while in the normal mode of operation, the control module further configured to respond to said particular command from the controller to enter into the recovery mode of operation, in which the operable device is configured to either:
(I) receive commands from the controller over at least one of the output ports;
or
(II) send data to the controller over at least one of the input ports;
in an upstream direction opposite to the downstream direction, depending on a directionality adopted by the operable device when in the recovery mode of operation.

16. The system defined in claim 15, wherein the control module of the operable device is configured to be attentive to receipt of said particular command.

17. The system defined in claim 16, wherein to be attentive to receipt of said command to enter into the recovery mode of operation, the operable device is configured to monitor at least one of the input ports for arrival of said particular command from a previous upstream device in the configuration of series-connected semiconductor memory devices.

18. The system defined in claim 17, wherein to be attentive to receipt of said command to enter into the recovery mode of operation, the operable device is further configured to monitor at least one of the output ports for arrival of said particular command from a next downstream device in the configuration of series-connected semiconductor memory devices.

19. The system defined in claim 11, wherein the operable device further comprises a switching element connected between the information storage medium, at least one of the input ports and at least one of the output ports, the switching element being configured to selectively permit data output by the information storage medium to appear on the at least one of the input ports or on the at least one of the output ports, in dependence upon a value of a select signal issued by the control module.

20. The system defined in claim 19, wherein the switching element is configured to permit data output by the information storage medium to appear on said at least one of the output ports when the operable device is:
in a normal mode of operation; or
(II) in the recovery mode of operation and is an aft branch device.

21. The system defined in claim 20, wherein the switching element is configured to permit data output by the information storage medium to appear on said at least one of the input ports when the operable device is in the recovery mode of operation and is a fore branch device.

22. The system defined in claim 11, wherein the alternate memory facility is another configuration of series-connected semiconductor memory devices.

23. The system defined in claim 11, wherein the operable device has a maximum rate of data transfer during operation in the recovery mode of operation that is lower than a maximum rate of data transfer during operation in a normal mode of operation.

24. A system, comprising:
- a configuration of series-connected semiconductor memory devices;
- an alternate memory facility;
- means for placing an operable device of the configuration of series-connected semiconductor memory devices into a recovery mode, the operable device not being a failed device of the configuration;
- means for retrieving data currently stored by the operable device while the operable device is in the recovery mode of operation; and
- means for transferring the retrieved data to the alternate memory facility.

\* \* \* \* \*